United States Patent
Hou et al.

(10) Patent No.: US 10,074,604 B1
(45) Date of Patent: Sep. 11, 2018

(54) INTEGRATED FAN-OUT PACKAGE AND METHOD OF FABRICATING THE SAME

(71) Applicant: Taiwan Semiconductor Manufacturing Co., Ltd., Hsinchu (TW)

(72) Inventors: Hao-Cheng Hou, Hsinchu (TW); Chien-Hsun Lee, Hsin-chu County (TW); Hung-Jen Lin, Tainan (TW); Jung-Wei Cheng, Hsinchu (TW); Tsung-Ding Wang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/499,903

(22) Filed: Apr. 28, 2017

(51) Int. Cl.
  *H01L 23/00* (2006.01)
  *H01L 23/522* (2006.01)
  *H01L 23/31* (2006.01)
  *H01L 23/12* (2006.01)

(52) U.S. Cl.
  CPC .......... *H01L 23/5226* (2013.01); *H01L 23/12* (2013.01); *H01L 23/3185* (2013.01); *H01L 24/05* (2013.01); *H01L 24/06* (2013.01); *H01L 2224/0231* (2013.01); *H01L 2224/05124* (2013.01)

(58) Field of Classification Search
  CPC . H01L 23/5226; H01L 23/12; H01L 23/3185; H01L 24/05; H01L 24/06; H01L 24/19; H01L 24/20; H01L 24/32; H01L 2224/0231; H01L 2224/05124; H01L 2224/7365; H01L 2224/12105
  See application file for complete search history.

(56) References Cited

U.S. PATENT DOCUMENTS

| | | | | |
|---|---|---|---|---|
| 8,174,109 B2 * | 5/2012 | Uchiyama | ............. | H01L 21/486 257/686 |
| 8,318,541 B2 * | 11/2012 | Shin | ........................ | H01L 25/16 257/E21.499 |
| 8,803,306 B1 * | 8/2014 | Yu | ........................... | H01L 21/78 257/686 |
| 9,000,584 B2 | 4/2015 | Lin et al. | | |
| 9,048,222 B2 | 6/2015 | Hung et al. | | |
| 9,048,233 B2 | 6/2015 | Wu et al. | | |

(Continued)

*Primary Examiner* — Nikolay Yushin
(74) *Attorney, Agent, or Firm* — JCIPRNET

(57) ABSTRACT

A method of fabricating an integrated fan-out package is provided. The method includes the followings. An integrated circuit component is mounted on a carrier. An insulating encapsulation is formed on the carrier to encapsulate sidewalls of the integrated circuit component. A plurality of conductive pillars are formed on the integrated circuit component and a dielectric layer is formed to cover the integrated circuit component and the insulating encapsulation, wherein the plurality of conductive pillars penetrate through the dielectric layer and are electrically connected to the integrated circuit component. A redistribution circuit structure is formed on the dielectric layer and the plurality of conductive pillars, wherein the redistribution circuit structure is electrically connected to the integrated circuit component through the plurality of conductive pillars, and the redistribution circuit structure and the insulating encapsulation are spaced apart by the dielectric layer.

20 Claims, 29 Drawing Sheets

(56) References Cited

U.S. PATENT DOCUMENTS

| | | | |
|---|---|---|---|
| 9,064,874 B2 | 6/2015 | Edelstein et al. | |
| 9,082,780 B2 * | 7/2015 | Lin | H01L 24/19 |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,691,706 B2 * | 6/2017 | Yu | H01L 23/5389 |
| 2010/0252937 A1 * | 10/2010 | Uchiyama | H01L 21/486 257/777 |
| 2012/0038034 A1 * | 2/2012 | Shin | H01L 25/16 257/676 |
| 2013/0187270 A1 * | 7/2013 | Yu | H01L 23/5389 257/737 |
| 2013/0249106 A1 * | 9/2013 | Lin | H01L 24/19 257/774 |
| 2014/0203429 A1 * | 7/2014 | Yu | H01L 21/78 257/737 |

\* cited by examiner

INTEGRATED FAN-OUT PACKAGE AND METHOD OF FABRICATING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages including at least one chip that is encapsulated by the molding compound, reliability of electrical connection between the chip and the redistribution circuit structure fabricated on the molding compound may deteriorate due to pits on the grinded surface of the molding compound. During the grinding process of the molding compound, the pits are generated on the grinded surface of the molding compound due to the filler of the molding compound. How to increase yield rate of the fabrication of integrated fan-out packages is highly concerned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
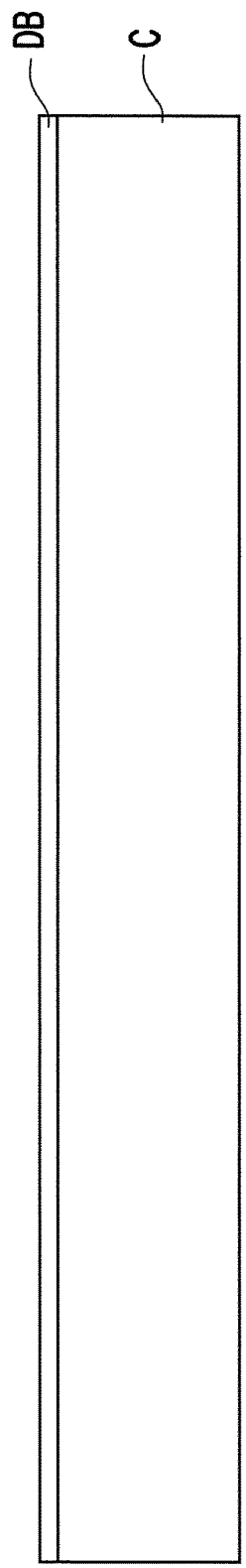
FIGS. 1 through 7 are cross-sectional views illustrating a process flow for fabricating an integrated fan-out package in accordance with the first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 7 are cross-sectional views illustrating a process flow for fabricating an integrated fan-out package in accordance with the first embodiment of the present disclosure.

Referring to FIG. 1, a carrier C having a de-bonding layer DB formed thereon is provided. The de-bonding layer DB is formed on an upper surface of the carrier C, for example. In some embodiments, the carrier C is a glass substrate, and the de-bonding layer DB is a light-to-heat conversion (LTHC) release layer or a dielectric layer formed on the glass substrate. However, the materials of the de-bonding layer DB and the carrier C are merely for illustration, and the disclosure is not limited thereto.

Figure 2:
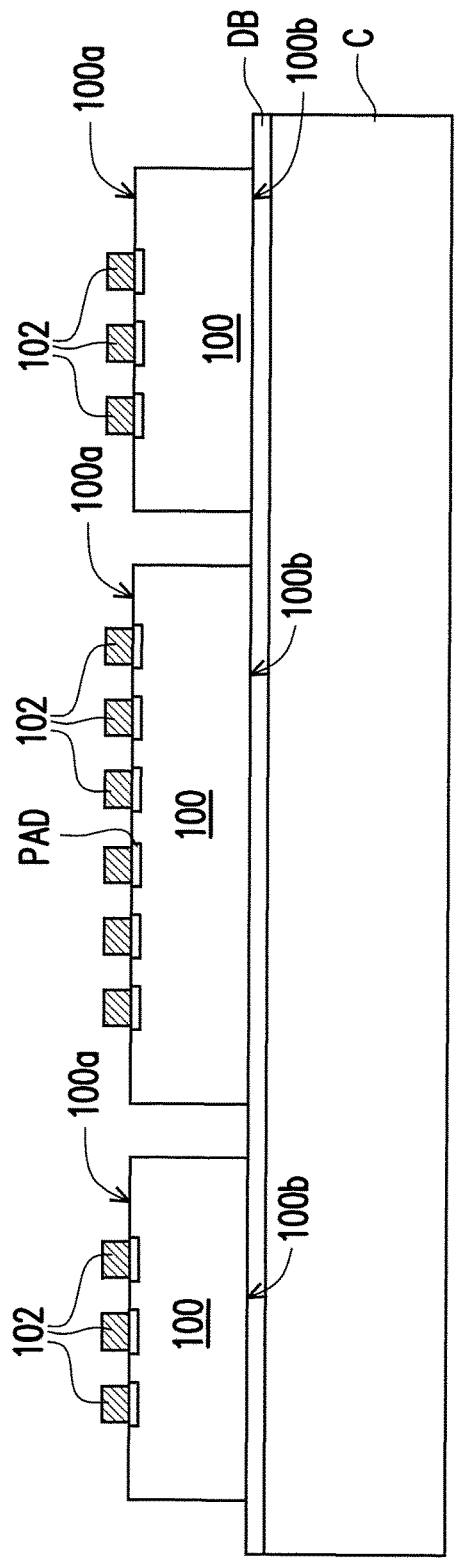

Referring to FIG. 2, one or more integrated circuit components 100 are picked-up and placed on the de-bonding layer DB carried by the carrier C. The integrated circuit components 100 may be substantially identical in thickness. Each of the integrated circuit components 100 may include an active surface 100$a$, a rear surface 100$b$ opposite to the active surface 100$a$ and a plurality of pads PAD (e.g., aluminum pads) distributed on the active surface 100$a$. The pads PAD are electrically connected to circuitry correspondingly formed in the integrated circuit components 100. The rear surfaces 100$b$ of the integrated circuit components 100 are adhered with the de-bonding layer DB carried by the carrier C.

In FIG. 2, three integrated circuit components 100 are mounted on the de-bonding layer DB carried by the carrier C. It may be noted that, the number of the integrated circuit components 100 is merely for illustration, and the disclosure is not limited thereto. In some alternative embodiments, before the integrated circuit components 100 are mounted on the de-bonding layer DB, an insulating layer (not shown) may be formed on the de-bonding layer DB in advance. The insulating layer is a polybenzoxazole (PBO) layer or other suitable polymer insulating layers, for example. In some embodiments, the integrated circuit components 100 may include a combination of high bandwidth memory (HBM) chips and at least one controller electrically connected the high bandwidth memory (HBM) chips. In some alternative embodiments, the integrated circuit components 100 may include various kinds of semiconductor chips, such as memory chips (e.g. SRAM, DRAM, RRAM and so on), application specific integrated circuits (ASICs), radio frequency integrated circuits (RF-ICs) or the combination thereof. The function of the integrated circuit components 100 mounted on the de-bonding layer DB carried by the carrier C is not limited in this disclosure.

As shown in FIG. 2, prior to mounting the integrated circuit components 100 on the de-bonding layer DB carried by the carrier C, a plurality of conductive vias or conductive pillars 102 electrically connected to the pads PAD of the integrated circuit components 100 are already formed on the active surfaces 100a of the integrated circuit components 100. The conductive pillars 102 extend away and substantially perpendicular from the pads PAD. The conductive pillars 102 may correspond in position to the pads PAD of the integrated circuit components 100. In other words, the conductive pillars 102 are substantially aligned with the pads PAD of the integrated circuit components 100. In some embodiments, the conductive pillars 102 on the active surface 100a of the integrated circuit components 100 are formed by wafer level plating process; and after the conductive pillars 102 are formed, a wafer saw process or a singulation process is performed to obtain the integrated circuit components 100. The integrated circuit components 100 mounted on the de-bonding layer DB carried by the carrier C may be fabricated or cut from the same wafer or from different wafers.

In some embodiments, the conductive pillars 102 may be copper pillars. In some alternative embodiments, the conductive pillars 102 may be copper pillars with solder caps (not shown) formed on the top surfaces thereof. The conductive pillars 102 may be made from other conductive materials and the disclosure is not limited thereto.

Figure 3:
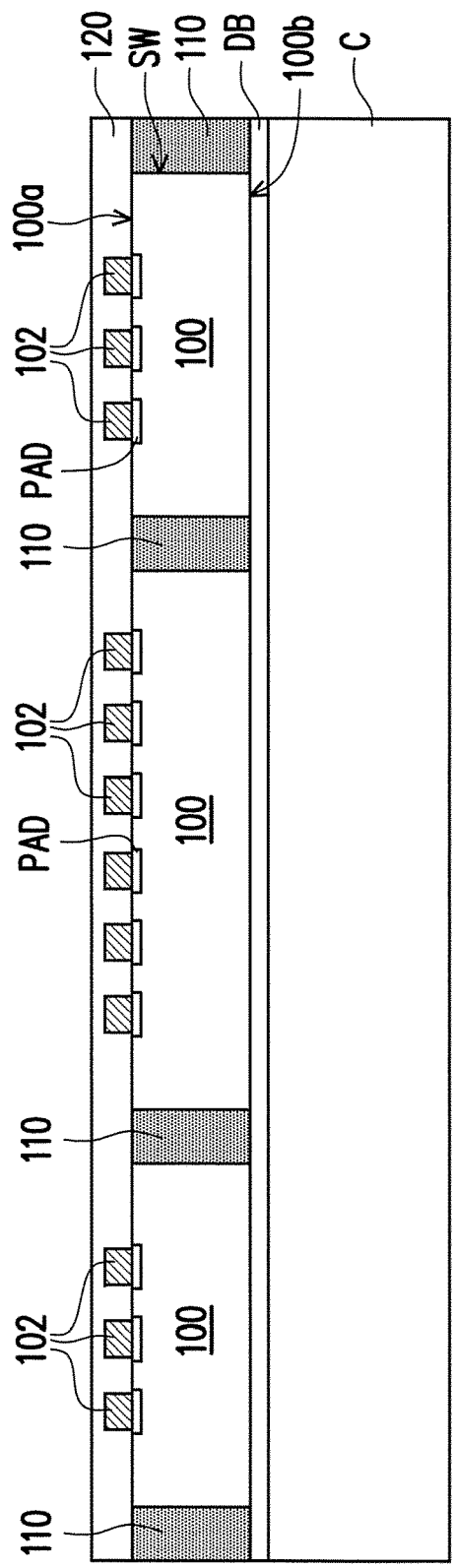

Referring to FIG. 3, after the conductive pillar 102 are formed, an insulating encapsulation 110 is then formed on the de-bonding layer DB carried by the carrier C, such that the sidewalls SW of the integrated circuit components 100 mounted on the de-bonding layer DB are laterally encapsulated by the insulating encapsulation 110. In some embodiments, the insulating encapsulation 110 is a molding compound formed by transfer molding process and the thickness of the insulating encapsulation 110 is substantially equal to the thickness of the integrated circuit components 100. Since the insulating encapsulation 110 is formed by transfer molding process, the top surface of the insulating encapsulation 110 is flat and smooth. The flat and smooth top surface of the insulating encapsulation 110 facilitates the subsequent processes. Furthermore, the conductive pillar 102 and the active surfaces 100a of the integrated circuit components 100 are accessibly exposed from the insulating encapsulation 110.

In some embodiments, the insulating encapsulation 110 is a filler-containing insulating encapsulation which is formed by transfer molding process, and no grinding process is needed to be performed during the fabrication of the filler-containing insulating encapsulation 110. Generally, the filler contained in the insulating encapsulation 110 are particles added to material (e.g. plastics, composite material, and so on) to lower consumption of more expensive binder material or to enhance certain properties of the mixed material such as electrical insulation or thermal dissipation. For example, the insulating encapsulation 110 may be epoxy resin and the filler added in the epoxy resin may be silica or aluminum oxide ($Al_2O_3$), or other suitable insulating material.

Since no grinding process is performed during the fabrication of the filler-containing insulating encapsulation 110, there is no pit generated on the top surface of the filler-containing insulating encapsulation 110. The flat and smooth top surface of the filler-containing insulating encapsulation 110 facilitates the fabrication of the subsequently formed thin films.

After forming the insulating encapsulation 110, a dielectric layer 120 is formed to cover the active surfaces 100a of the integrated circuit components 100 and the top surface of the insulating encapsulation 110 such that he conductive pillars 102 are encapsulated and protected by the dielectric layer 120. As shown in FIG. 3, the dielectric layer 120 may be a polybenzoxazole (PBO) layer or other suitable polymer dielectric layers, for example. In some embodiments, no filler is added in the dielectric layer 120.

Figure 4:
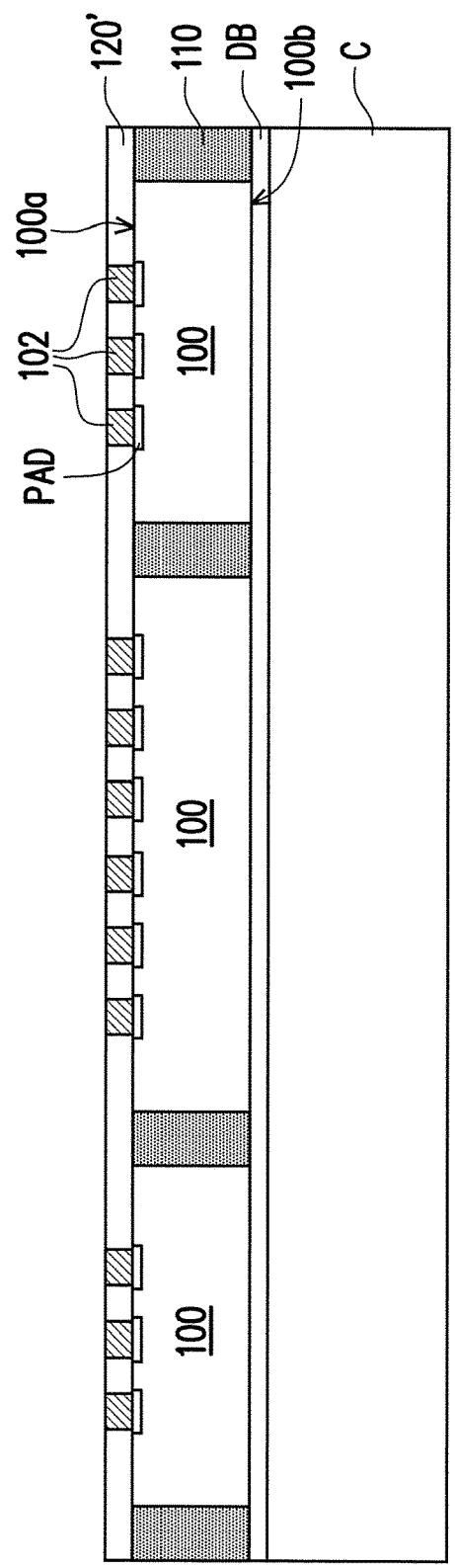

Referring to FIG. 3 and FIG. 4, a grinding process is performed on the dielectric layer 120 until the top surfaces of the conductive pillars 102 are exposed. After the grinding process of the dielectric layer 120 is performed, a dielectric layer 120' with reduced thickness is formed and the thickness of the dielectric layer 120' is substantially equal to the height of the conductive pillars 102. As shown in FIG. 4, after the grinding process is performed, the conductive pillars 102 penetrate through the dielectric layer 120' and the first conductive pillars 102 are laterally encapsulated by the dielectric layer 120'. Furthermore, the top surface of the dielectric layer 120' and the top surfaces of the conductive pillars 102 are substantially coplanar.

Since the dielectric layer 120' contains no filler, there is no pit generated on the grinded top surface of the dielectric layer 120' after the grinding process is performed. The flat and smooth grinded surface of the dielectric layer 120' facilitates the fabrication of the subsequently formed thin films.

Figure 5:
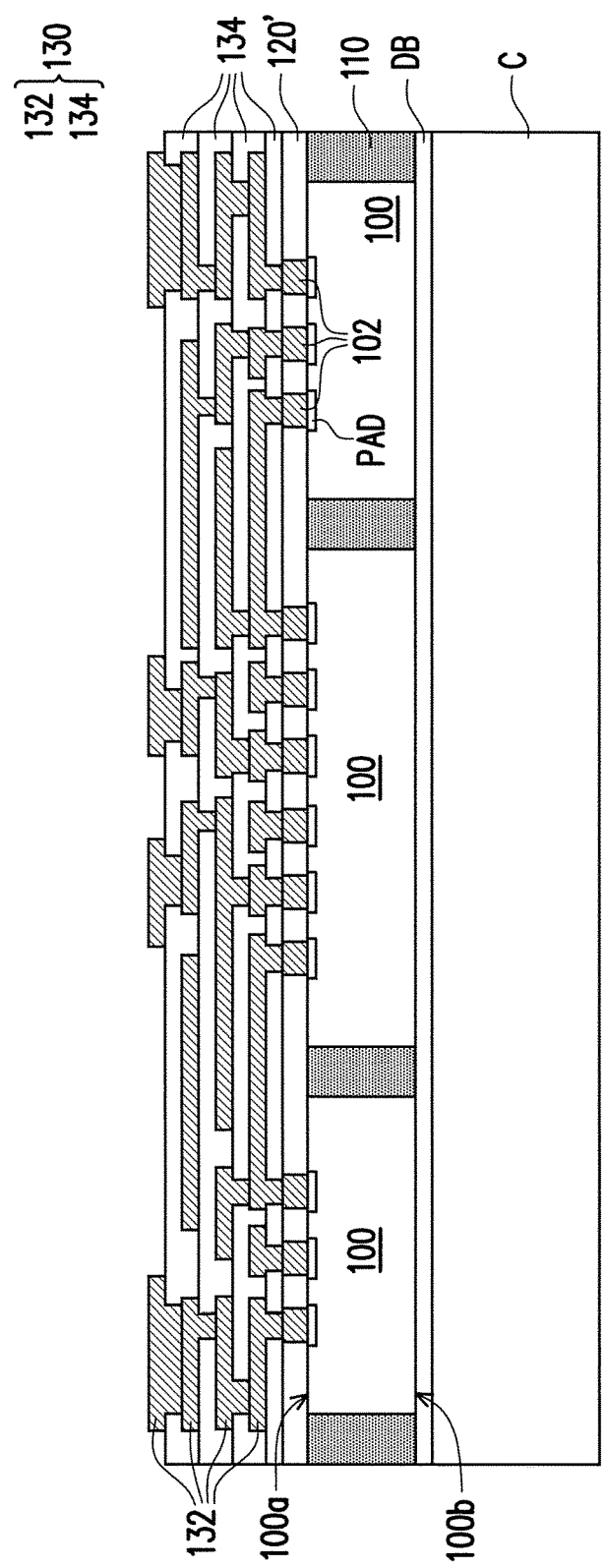

Referring to FIG. 5, after forming the dielectric layer 120', a redistribution circuit structure 130 is formed on the dielectric layer 120' and the conductive pillars 102. The redistribution circuit structure 130 is electrically connected to the pads PAD of the integrated circuit components 100 through the conductive pillars 102. Furthermore, the redistribution circuit structure 130 and the insulating encapsulation 110 are spaced apart by the dielectric layer 120'.

As shown in FIG. 5, the redistribution circuit structure 130 includes a plurality of redistribution conductive layers 132 and a plurality of inter-dielectric layers 134 stacked alternately. The redistribution circuit structure 130 provides fan-out function. At least parts of the redistribution conductive layers 132 extend laterally and provide re-layout function. To provide the above-mentioned re-layout or fan-out function, a plurality contact windows may be formed in the inter-dielectric layers 134 and the redistribution conductive layers 132 may be electrically connected to the conductive layer(s) underneath through the contact windows formed in the inter-dielectric layers 134. The redistribution conductive layers 132 not only fill the contact windows and extend vertically in the contact windows, but also extend laterally or horizontally on the top surfaces of the inter-dielectric layers 134.

Figure 6:
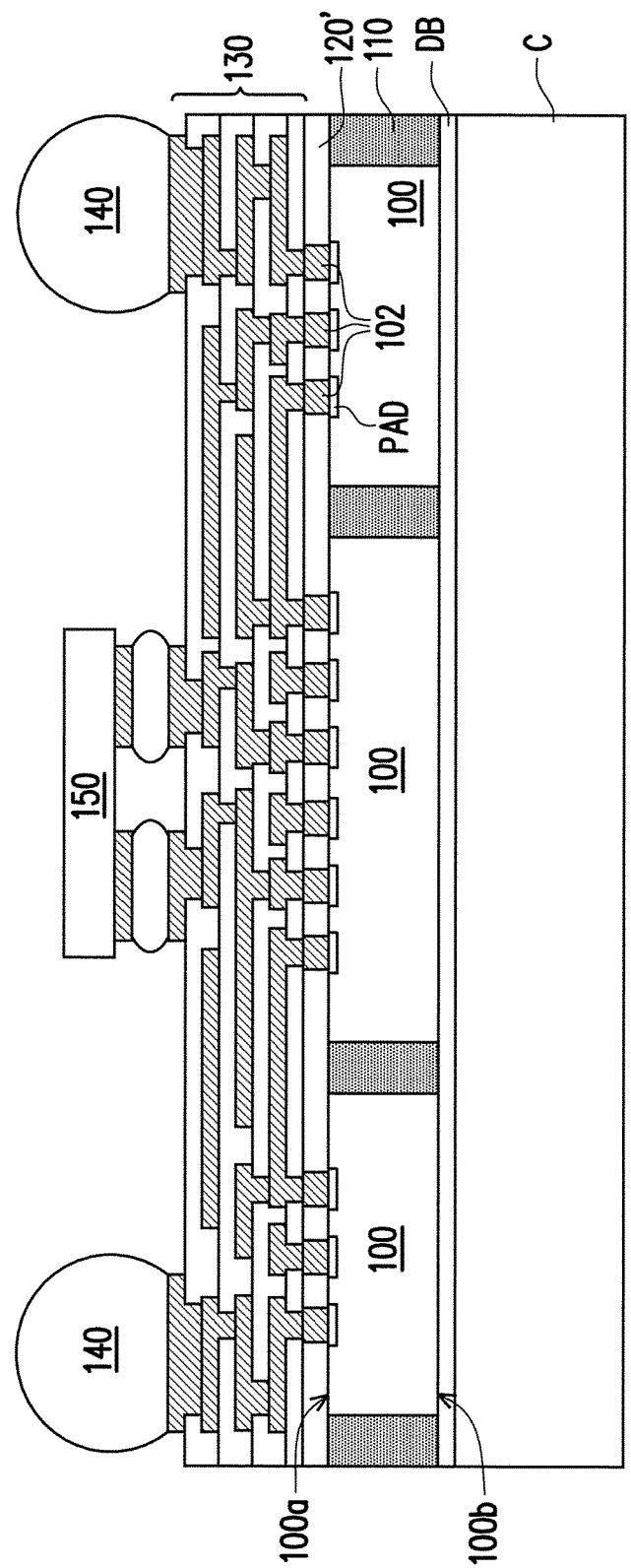

Referring to FIG. 6, after forming the redistribution circuit structure 130, a plurality of conductive terminals 140 and/or at least one passive component 150 are placed on the redistribution circuit structure 130. The conductive terminals 140 and/or the at least one passive component 150 are electrically connected to the redistribution circuit structure 130. In some embodiments, the conductive terminals 140 may be placed on the redistribution circuit structure 130 by ball placement process and reflow process, while the at least one passive component 150 may be mounted on the redistribution circuit structure 130 through reflow process. In some alternative embodiments, the conductive terminals 140 may be controlled collapse chip connection (i.e. C4) bumps or copper bumps.

Figure 7:
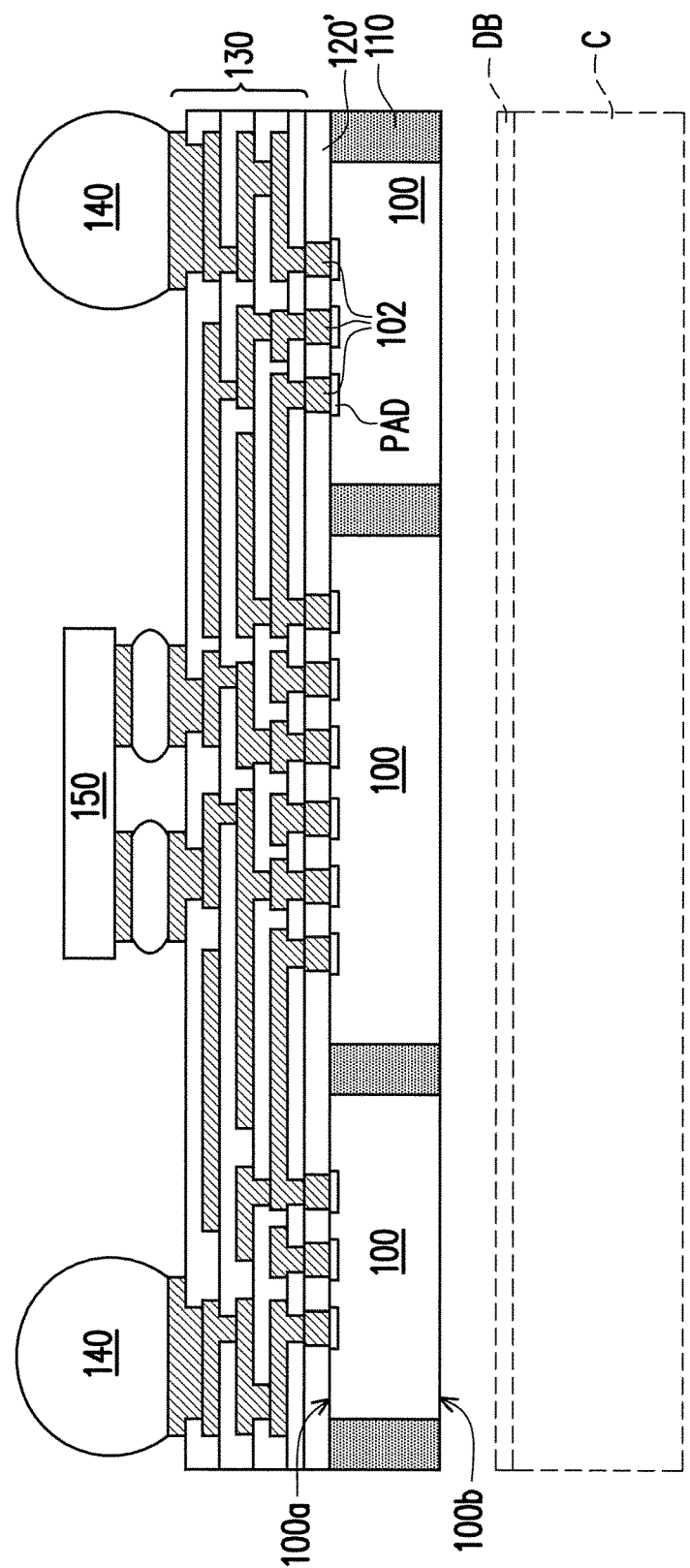

Referring to FIG. 7, after the conductive terminals 140 and/or the at least one passive component 150 are mounted on the redistribution circuit structure 130, the de-bonding layer DB and the carrier C are de-bonded from the integrated circuit components 100 and the insulating encapsulation 110. In some embodiments, the de-bonding layer DB (e.g., the LTHC release layer) may be irradiated by an UV laser such that the de-bonding process of the de-bonding layer DB and the carrier C is facilitated.

FIGS. 8 through 14 are cross-sectional views illustrating a process flow for fabricating an integrated fan-out package in accordance with the second embodiment of the present disclosure.

Figure 8:
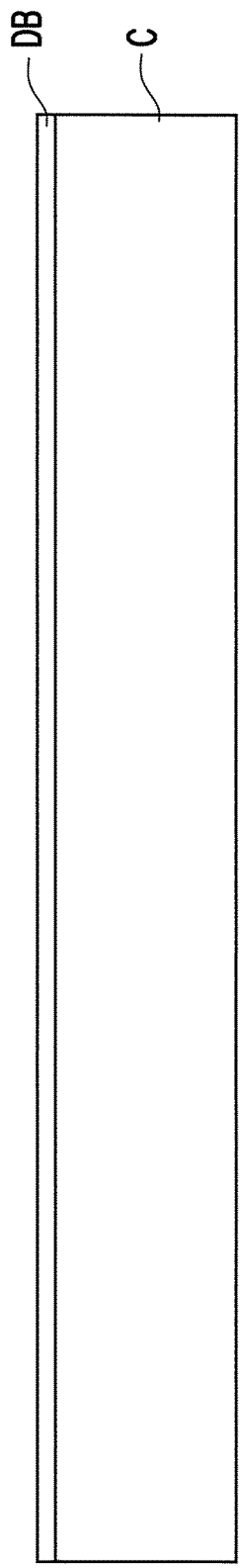
FIGS. 8 through 14 are cross-sectional s illustrating a process flow for fabricating an integrated fan-out package in accordance with the second embodiment of the present disclosure.

Referring to FIG. 8, a carrier C having a de-bonding layer DB formed thereon is provided. The de-bonding layer DB is formed on an upper surface of the carrier C, for example. In some embodiments, the carrier C is a glass substrate, and the de-bonding layer DB is a light-to-heat conversion (LTHC) release layer or a dielectric layer formed on the glass substrate. However, the materials of the de-bonding layer DB and the carrier C are merely for illustration, and the disclosure is not limited thereto.

Figure 9:
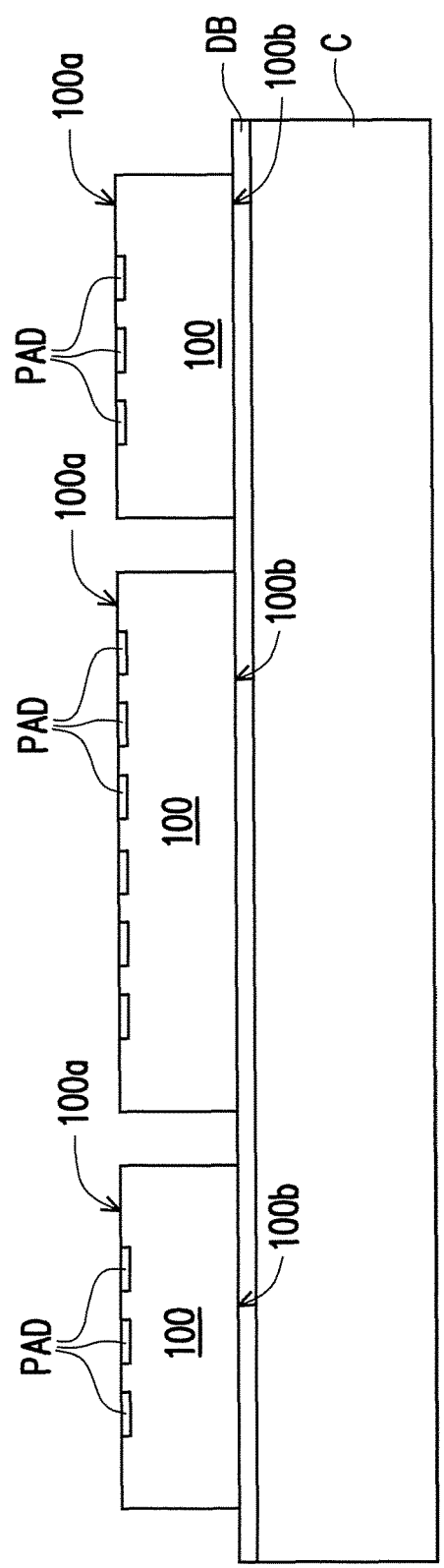

Referring to FIG. 9, one or more integrated circuit components 100 are picked-up and placed on the de-bonding layer DB carried by the carrier C. The integrated circuit components 100 may be substantially identical in thickness. Each of the integrated circuit components 100 may include an active surface 100a, a rear surface 100b opposite to the active surface 100a and a plurality of pads PAD (e.g., aluminum pads) distributed on the active surface 100a. The pads PAD are electrically connected to circuitry correspondingly formed in the integrated circuit components 100. The rear surfaces 100b of the integrated circuit components 100 are adhered with the de-bonding layer DB carried by the carrier C.

In FIG. 9, three integrated circuit components 100 are mounted on the de-bonding layer DB carried by the carrier C. It may be noted that, the number of the integrated circuit components 100 is merely for illustration, and the disclosure is not limited thereto. In some alternative embodiments, before the integrated circuit components 100 are mounted on the de-bonding layer DB, an insulating layer (not shown) may be formed on the de-bonding layer DB in advance. The insulating layer is a polybenzoxazole (PBO) layer or other suitable polymer insulating layers, for example. In some embodiments, the integrated circuit components 100 may include a combination of high bandwidth memory (HBM) chips and at least one controller electrically connected the high bandwidth memory (HBM) chips. In some alternative embodiments, the integrated circuit components 100 may include various kinds of semiconductor chips, such as memory chips (e.g. SRAM, DRAM, RRAM and so on), application specific integrated circuits (ASICs), radio frequency integrated circuits (RF-ICs) or the combination thereof. The function of the integrated circuit components 100 mounted on the de-bonding layer DB carried by the carrier C is not limited in this disclosure.

As shown in FIG. 9, an insulating encapsulation 110 is formed on the de-bonding layer DB carried by the carrier C such that the sidewalls SW of the integrated circuit components 100 are laterally encapsulated by the insulating encapsulation 110. In some embodiments, the insulating encapsulation 110 is a molding compound formed by transfer molding process and the thickness of the insulating encapsulation 110 is substantially equal to the thickness of the integrated circuit components 100. Since the insulating encapsulation 110 is formed by transfer molding process, the top surface of the insulating encapsulation 110 is flat and smooth. The flat and smooth top surface of the insulating encapsulation 110 facilitates the subsequent processes. Furthermore, the active surfaces 100a of the integrated circuit components 100 are accessibly exposed from the insulating encapsulation 110.

In some embodiments, the insulating encapsulation 110 is a filler-containing insulating encapsulation, the filler-containing insulating encapsulation 110 is formed by transfer molding process, and no grinding process is needed to be performed during the fabrication of the filler-containing insulating encapsulation 110. Generally, the filler contained in the insulating encapsulation 110 are particles added to material (e.g. plastics, composite material, and so on) to lower the consumption of more expensive binder material or to enhance some properties of the mixed material. For example, the insulating encapsulation 110 may be epoxy resin and the filler added in the epoxy resin may be silica or aluminum oxide ($Al_2O_3$), or other suitable insulating material.

Since no grinding process is performed during the fabrication of the filler-containing insulating encapsulation 110, there is no pit generated on the top surface of the filler-containing insulating encapsulation 110. The flat and smooth top surface of the filler-containing insulating encapsulation 110 facilitates the fabrication of the subsequently formed thin films.

Figure 10:
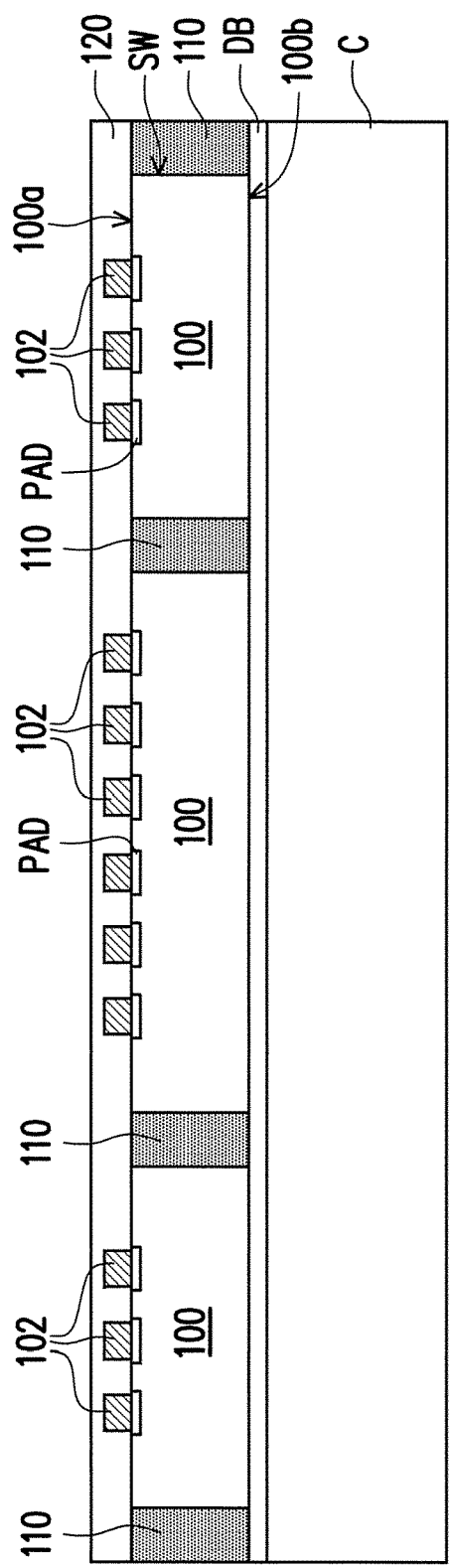
Figure 11:
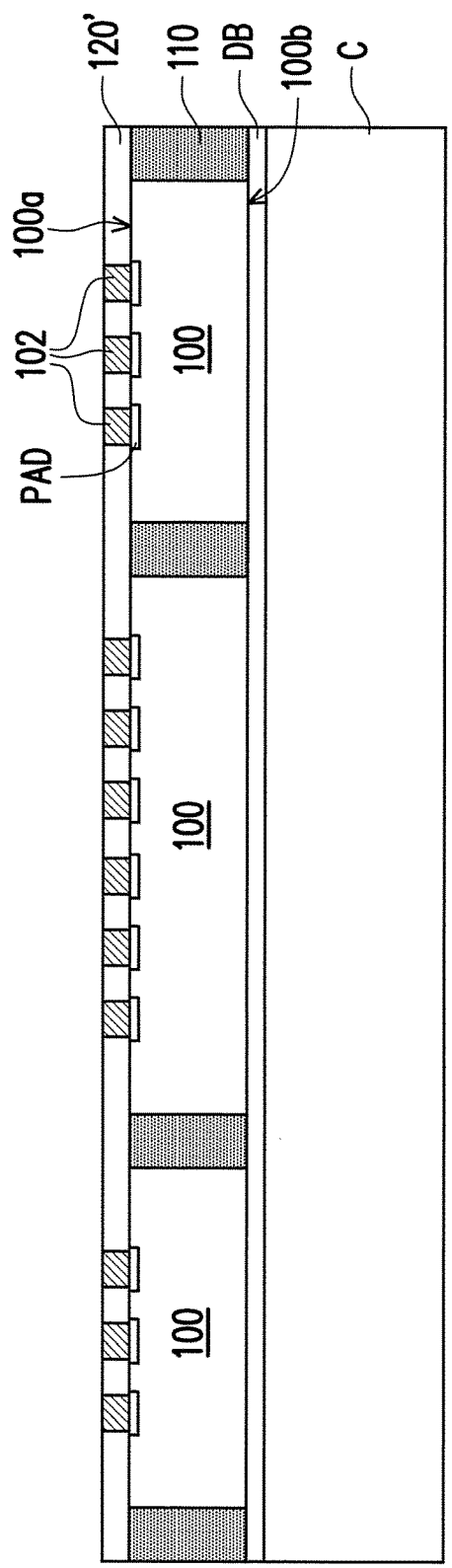
Figure 12:
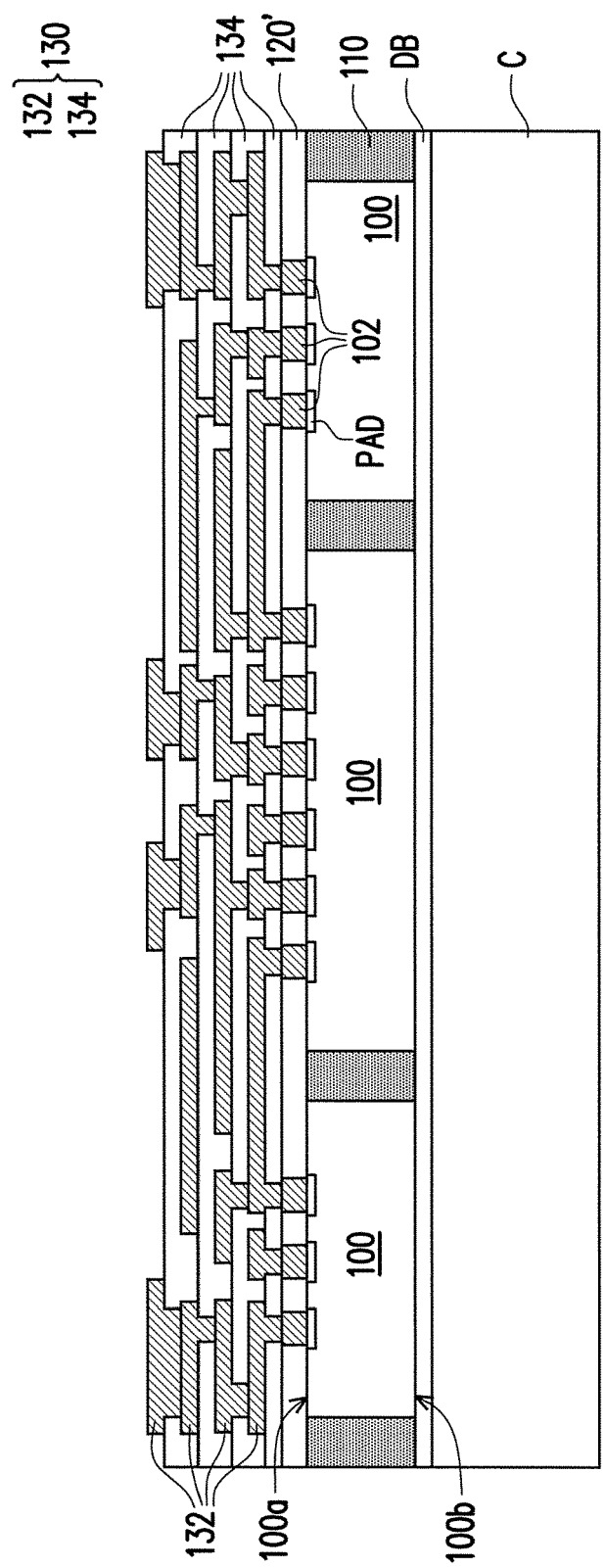
Figure 13:
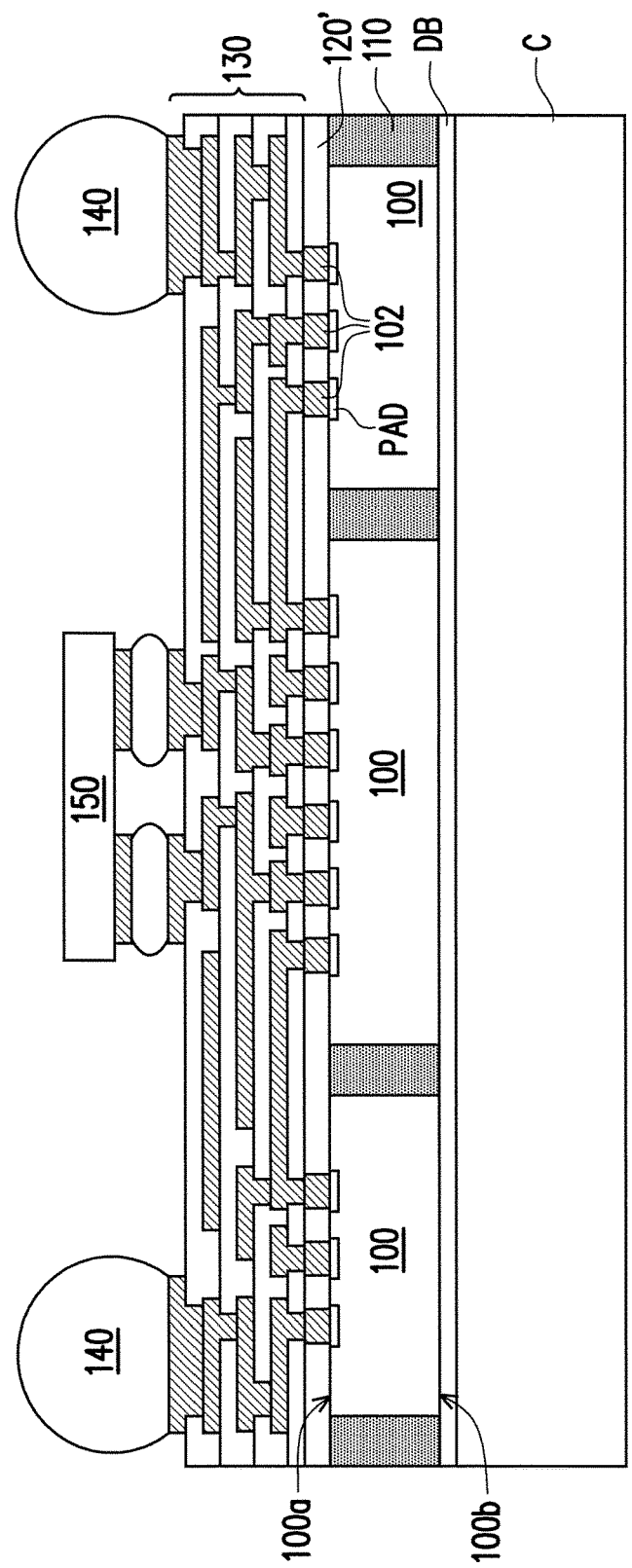
Figure 14:
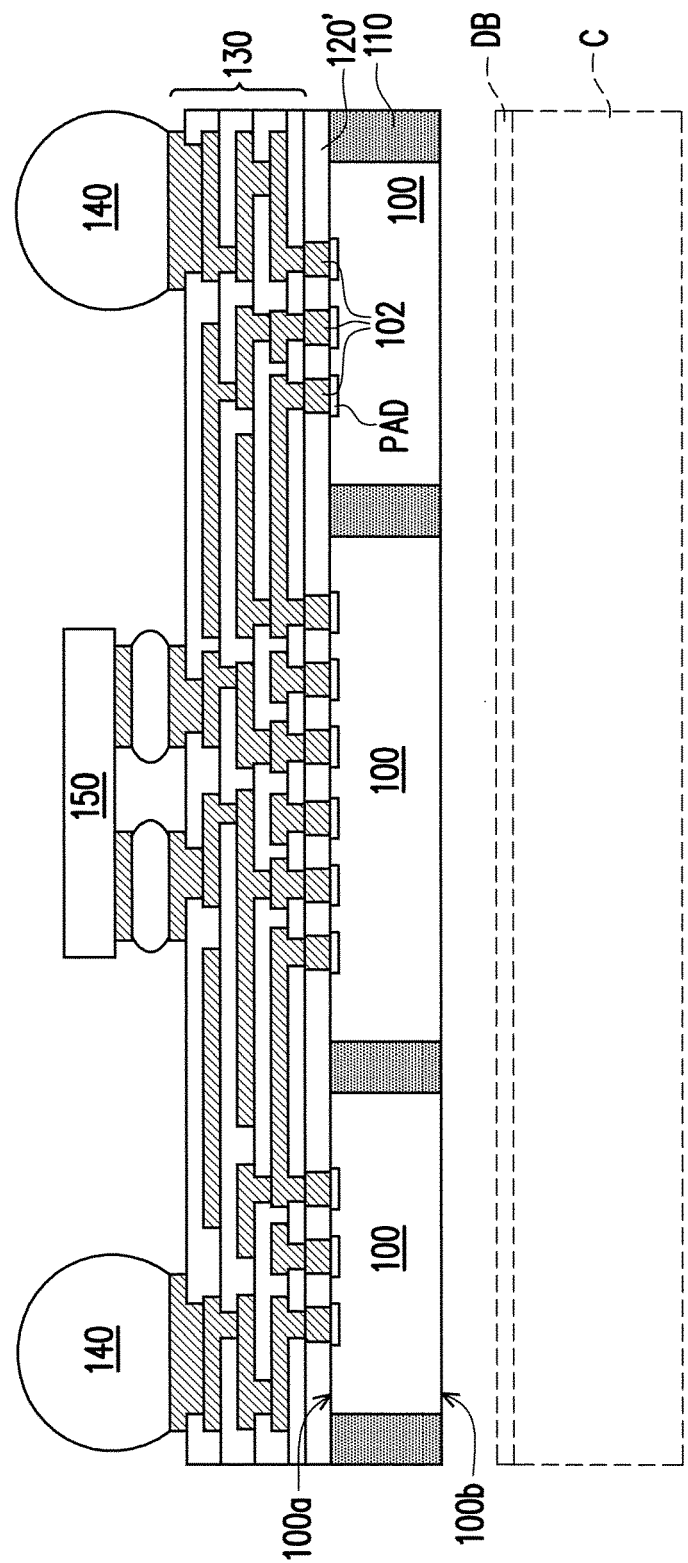

Referring to FIG. 10, after mounting the integrated circuit components 100 on the de-bonding layer DB carried by the carrier C, a plurality of conductive pillars 102 electrically connected to the pads PAD of the integrated circuit components 100 are formed on the active surfaces 100a of the integrated circuit components 100. The conductive pillars 102 extend away and substantially perpendicular from the pads PAD. The conductive pillars 102 may correspond in position to the pads PAD of the integrated circuit components 100. In other words, the conductive pillars 102 are substantially aligned with the pads PAD of the integrated circuit components 100.

In some embodiments, the conductive pillars 102 may be copper pillars. In some alternative embodiments, the conductive pillars 102 may be copper pillars with solder caps (not shown) formed on top surfaces thereof. The conductive pillars 102 may be made from other conductive materials and the disclosure is not limited thereto.

After forming the insulating encapsulation 110, a dielectric layer 120 is formed to cover the active surfaces 100a of the integrated circuit components 100 and the top surface of the insulating encapsulation 110. The conductive pillars 102 are encapsulated and protected by the dielectric layer 120. As shown in FIG. 10, the dielectric layer 120 is a polybenzoxazole (PBO) layer or other suitable polymer dielectric layers, for example. In some embodiments, no filler is added in the dielectric layer 120.

Referring to FIG. 11 through FIG. 14, the processes (i.e. the grinding process, the RDL formation process, mounting process of the conductive terminals 140 and/or the at least one passive component 150, and the de-bonding process) illustrated in FIG. 11 through FIG. 14 are similar with those illustrated in FIG. 4 through FIG. 7 and the detailed descriptions thereof are thus omitted.

FIGS. 15 through 21 are cross-sectional views illustrating a process flow for fabricating an integrated fan-out package in accordance with the third embodiment of the present disclosure.

Figure 15:
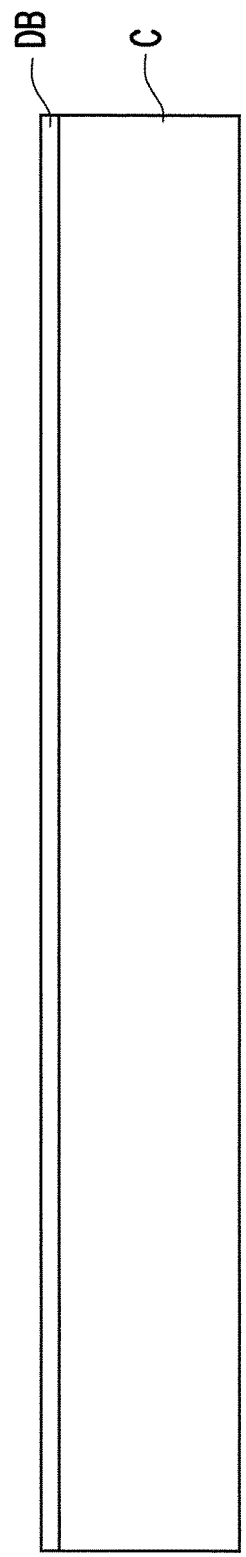
FIGS. 15 through 21 are cross-sectional views illustrating a process flow for fabricating an integrated fan-out package in accordance with the third embodiment of the present disclosure.

Referring to FIG. 15, a carrier C having a de-bonding layer DB formed thereon is provided. The de-bonding layer DB is formed on an upper surface of the carrier C, for example. In some embodiments, the carrier C is a glass substrate, and the de-bonding layer DB is a light-to-heat conversion (LTHC) release layer or a dielectric layer formed on the glass substrate. However, the materials of the de-bonding layer DB and the carrier C are merely for illustration, and the disclosure is not limited thereto.

Figure 16:
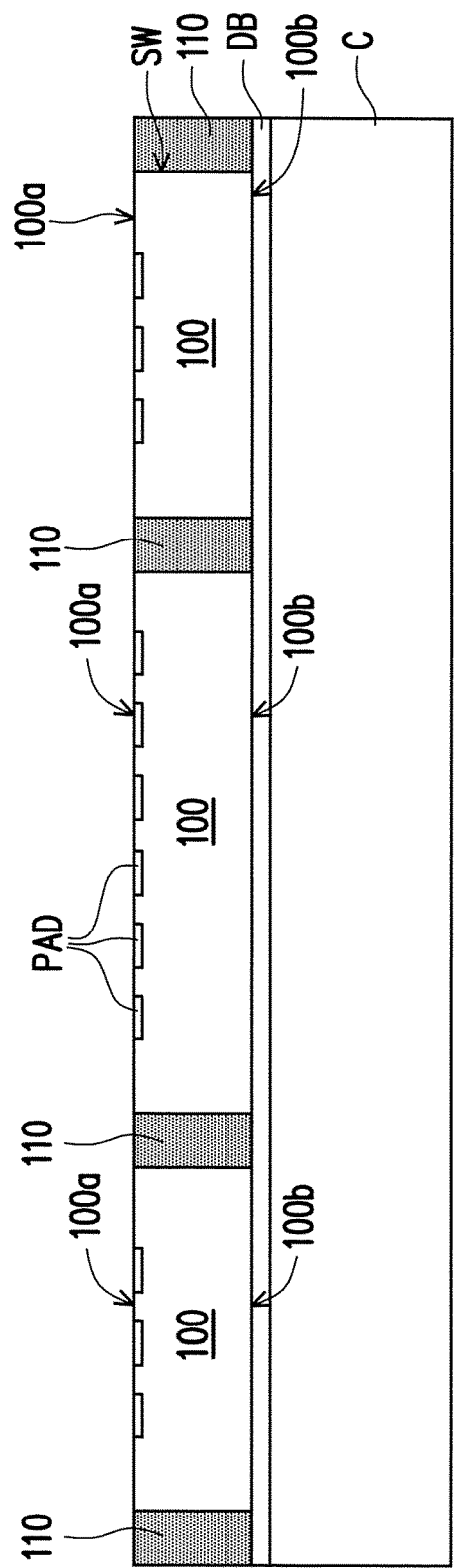

Referring to FIG. 16, one or more integrated circuit components 100 are picked-up and placed on the de-bonding layer DB carried by the carrier C. The integrated circuit components 100 may be substantially identical in thickness. Each of the integrated circuit components 100 may include an active surface 100a, a rear surface 100b opposite to the active surface 100a and a plurality of pads PAD (e.g. aluminum pads) distributed on the active surface 100a. The pads PAD are electrically connected to circuitry correspondingly formed in the integrated circuit components 100. The rear surfaces 100b of the integrated circuit components 100 are adhered with the de-bonding layer DB carried by the carrier C.

In FIG. 16, three integrated circuit components 100 are mounted on the de-bonding layer DB carried by the carrier C. It may be noted that, the number of the integrated circuit components 100 is merely for illustration, and the disclosure is not limited thereto. In some alternative embodiments, before the integrated circuit components 100 are mounted on the de-bonding layer DB, an insulating layer (not shown) may be formed on the de-bonding layer DB. The insulating layer is a polybenzoxazole (PBO) layer or other suitable polymer insulating layers, for example. In some embodiments, the integrated circuit components 100 may include a combination of high bandwidth memory (HBM) chips and at least one controller electrically connected the high bandwidth memory (HBM) chips. In some alternative embodiments, the integrated circuit components 100 may include various kinds of semiconductor chips, such as memory chips (e.g. SRAM, DRAM, RRAM and so on), application specific integrated circuits (ASICs), radio frequency integrated circuits (RF-ICs) or the combination thereof. The function of the integrated circuit components 100 mounted on the de-bonding layer DB carried by the carrier C is not limited in this disclosure.

As shown in FIG. 16, an insulating encapsulation 110 is formed on the de-bonding layer DB carried by the carrier C such that the sidewalls SW of the integrated circuit components 100 are laterally encapsulated by the insulating encapsulation 110. In some embodiments, the insulating encapsulation 110 is a molding compound formed by transfer molding process and the thickness of the insulating encapsulation 110 is substantially equal to the thickness of the integrated circuit components 100. Since the insulating encapsulation 110 is formed by transfer molding process, the top surface of the insulating encapsulation 110 is flat and smooth. The flat and smooth top surface of the insulating encapsulation 110 facilitates the subsequent processes. Furthermore, the active surfaces 100a of the integrated circuit components 100 are accessibly exposed from the insulating encapsulation 110.

In some embodiments, the insulating encapsulation 110 is a filler-containing insulating encapsulation, the filler-containing insulating encapsulation 110 is formed by transfer molding process, and no grinding process is needed to be performed during the fabrication of the filler-containing insulating encapsulation 110. Generally, the filler contained in the insulating encapsulation 110 are particles added to material (e.g. plastics, composite material, and so on) to lower the consumption of more expensive binder material or to enhance some properties of the mixed material. For example, the insulating encapsulation 110 may be epoxy resin and the filler added in the epoxy resin may be silica or aluminum oxide ($Al_2O_3$), or other suitable insulating material.

Since no grinding process is performed during the fabrication of the filler-containing insulating encapsulation 110, there is no pit generated on the top surface of the filler-containing insulating encapsulation 110. The flat and smooth top surface of the filler-containing insulating encapsulation 110 facilitates the fabrication of the subsequently formed thin films.

Figure 17:
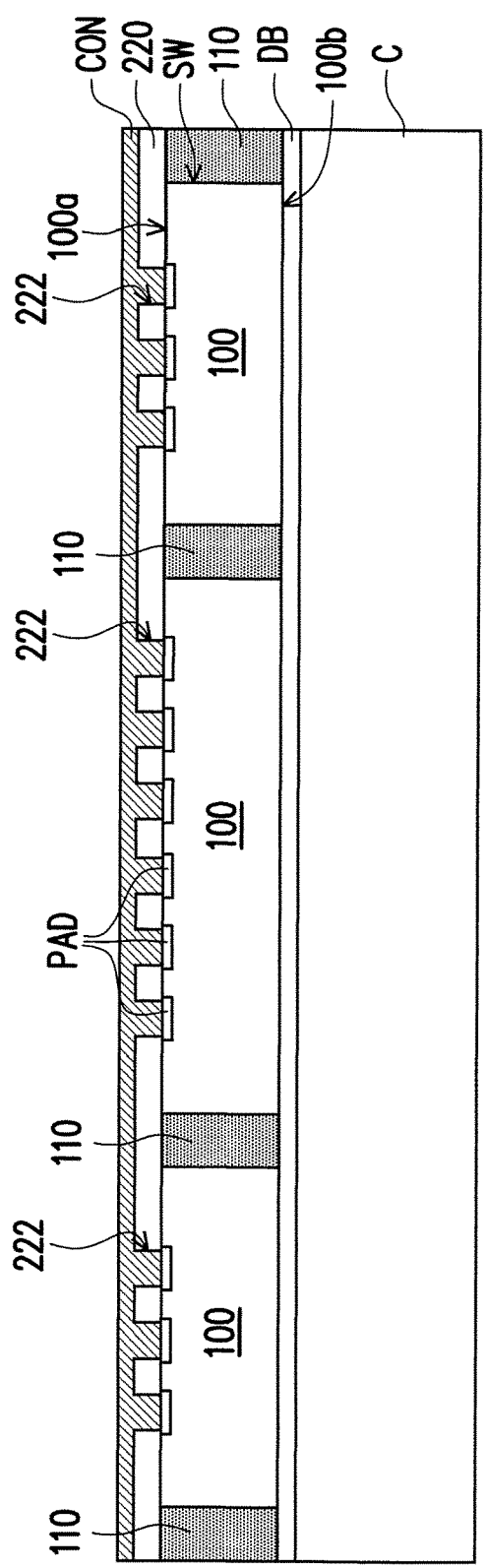

Referring to FIG. 17, after mounting the integrated circuit components 100 on the de-bonding layer DB carried by the carrier C, a dielectric layer 220 having a plurality of openings 222 therein is formed on the active surfaces 100a of the integrated circuit components 100 and the top surface of the insulating encapsulation 110. As shown in FIG. 17, the dielectric layer 220 is a polybenzoxazole (PBO) layer or other suitable polymer dielectric layers, for example. In some embodiments, no filler is added in the dielectric layer 220. After forming the dielectric layer 220 having the openings 222, a conductive material layer CON is formed on the dielectric layer 220 and fills the openings 222 in the dielectric layer 220. In some embodiments, the conductive material layer CON may be formed by chemical vapor deposition (CVD), physical vapor deposition (PVD) or other suitable deposition processes.

Figure 18:
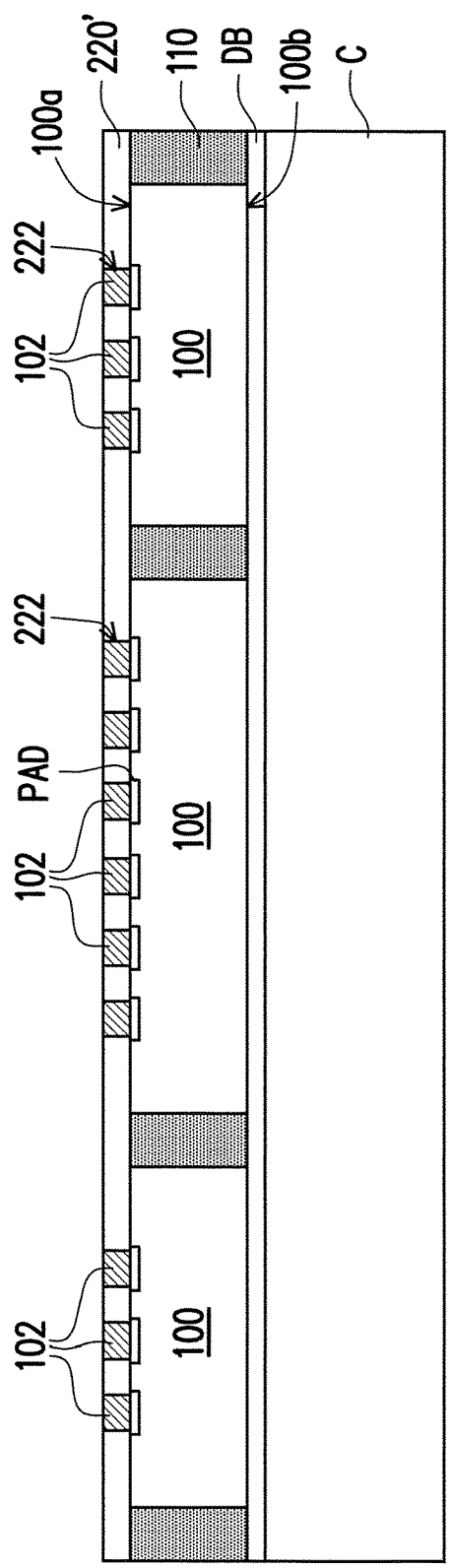

Referring to FIG. 18, a grinding or a polishing process is performed to partially remove the conductive material layer CON until the dielectric layer 220 is exposed. In some embodiments, the polishing process used to pattern the conductive material layer CON may be chemical mechanical polishing (CMP) process. After the conductive material layer CON is partially removed, a plurality of conductive pillars 102 electrically connected to the pads PAD of the integrated circuit components 100 are formed in the openings 222. The conductive pillars 102 extend away and substantially perpendicular from the pads PAD. The conductive pillars 102 may correspond in position to the pads PAD of the integrated circuit components 100. In other words, the conductive pillars 102 are substantially aligned with the pads PAD of the integrated circuit components 100.

In some embodiments, the conductive pillars 102 may be copper pillars. In some alternative embodiments, the conductive pillars 102 may be copper pillars with solder caps (not shown) formed on top surfaces thereof. The conductive pillars 102 may be made from other conductive materials and the disclosure is not limited thereto. In the embodiment illustrated in FIG. 18, before the formation of the conductive pillars 102, the dielectric layer 220 having the openings 222 defined therein is formed in advance.

Figure 19:
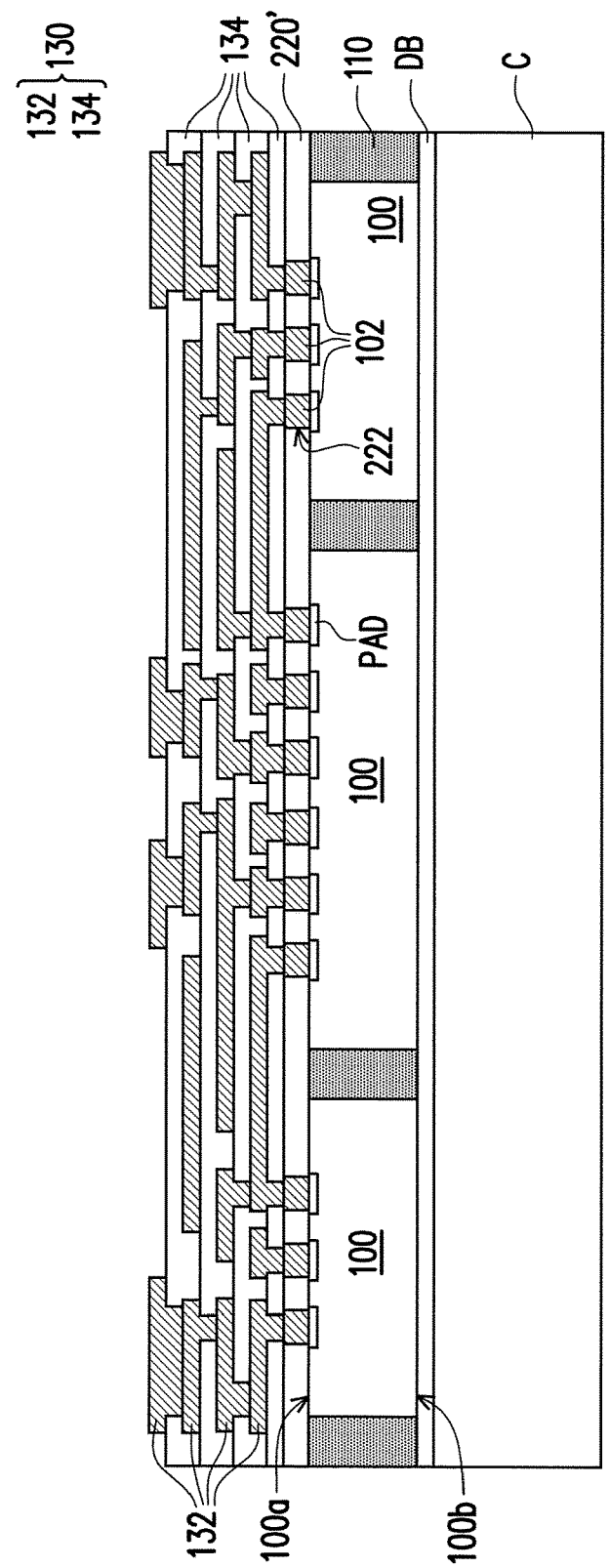
Figure 20:
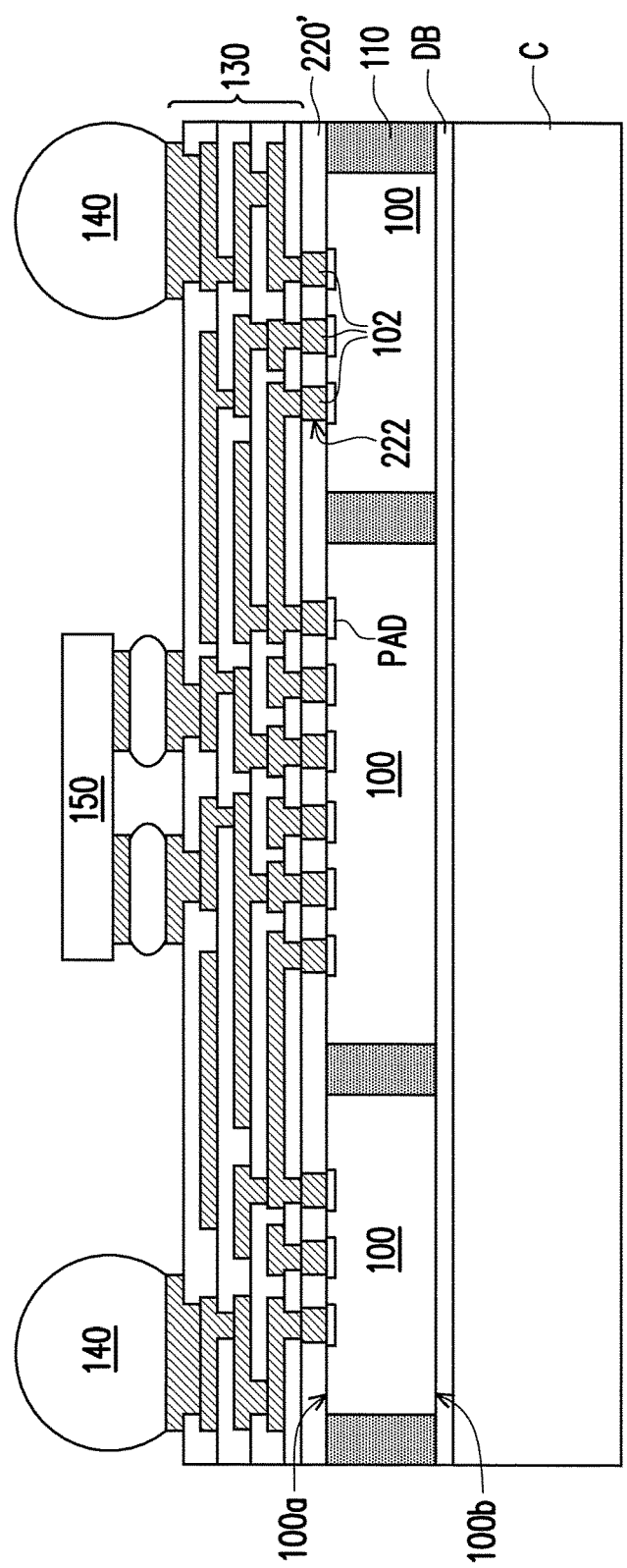
Figure 21:
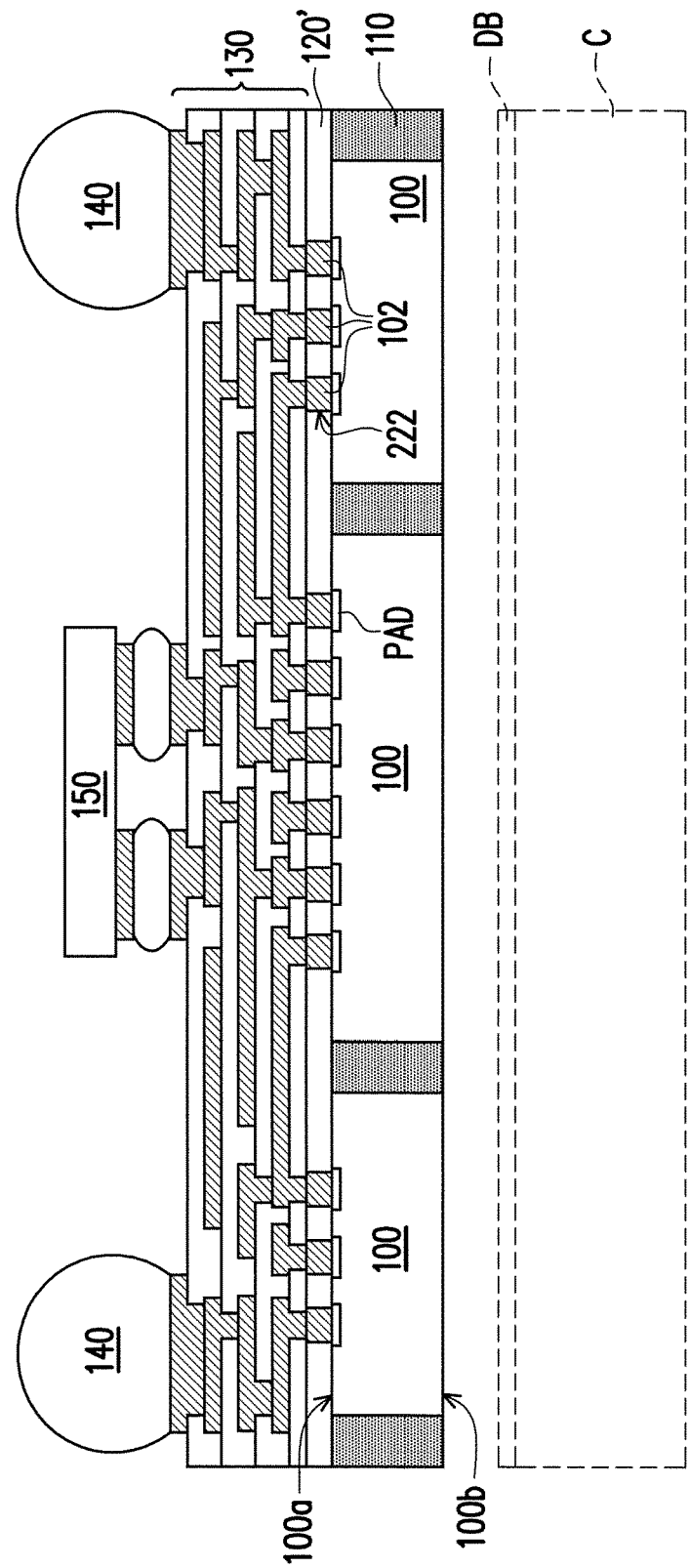

Referring to FIG. 19 through FIG. 21, the processes (i.e. the grinding process, the RDL formation process, mounting process of the conductive terminals 140 and/or the at least one passive component 150, and the de-bonding process) illustrated in FIG. 19 through FIG. 21 are similar with those illustrated in FIG. 4 through FIG. 7 and the detailed descriptions thereof are thus omitted.

FIGS. 22 through 29 are cross-sectional views illustrating a process flow for fabricating an integrated fan-out package in accordance with the fourth embodiment of the present disclosure.

Figure 22:
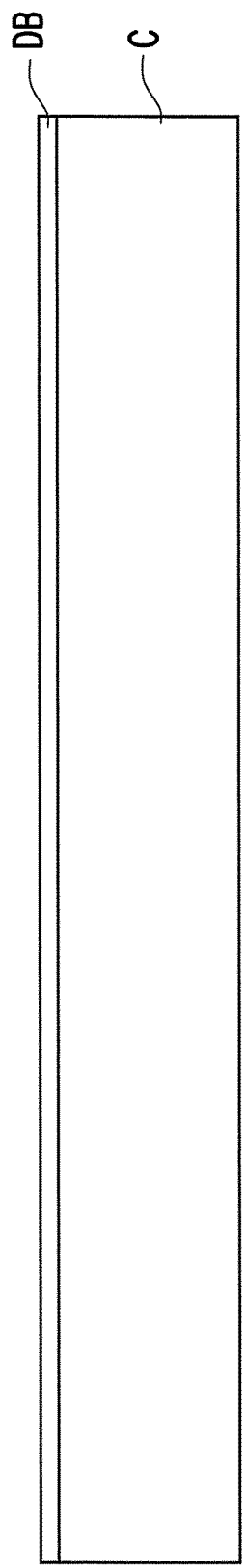
FIGS. 22 through 29 are cross-sectional views illustrating a process flow for fabricating an integrated fan-out package in accordance with the fourth embodiment of the present disclosure.

Referring to FIG. 22, a carrier C having a de-bonding layer DB formed thereon is provided. The de-bonding layer DB is formed on an upper surface of the carrier C, for example. In some embodiments, the carrier C is a glass substrate, and the de-bonding layer DB is a light-to-heat conversion (LTHC) release layer or a dielectric layer formed on the glass substrate. However, the materials of the de-bonding layer DB and the carrier C are merely for illustration, and the disclosure is not limited thereto.

Figure 23:
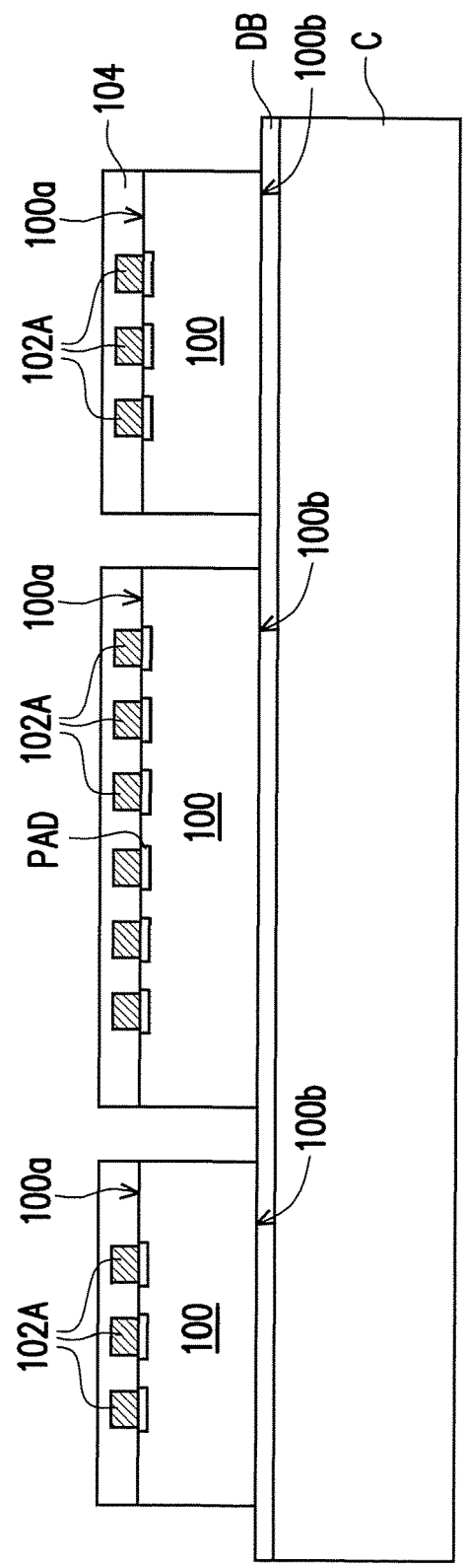

Referring to FIG. 23, one or more integrated circuit components 100 are picked-up and placed on the de-bonding layer DB carried by the carrier C. The integrated circuit components 100 may be substantially identical in thickness. Each of the integrated circuit components 100 may include an active surface 100a, a rear surface 100b opposite to the active surface 100a and a plurality of pads PAD (e.g. aluminum pads) distributed on the active surface 100a. The pads PAD are electrically connected to circuitry correspondingly formed in the integrated circuit components 100. The rear surfaces 100b of the integrated circuit components 100 are adhered with the de-bonding layer DB carried by the carrier C.

In FIG. 23, three integrated circuit components 100 are mounted on the de-bonding layer DB carried by the carrier C. It may be noted that, the number of the integrated circuit components 100 is merely for illustration, and the disclosure is not limited thereto. In some alternative embodiments, before the integrated circuit components 100 are mounted on the de-bonding layer DB, an insulating layer (not shown) may be formed on the de-bonding layer DB. The insulating layer is a polybenzoxazole (PBO) layer or other suitable polymer insulating layers, for example. In some embodiments, the integrated circuit components 100 may include a combination of high bandwidth memory (HBM) chips and at least one controller electrically connected the high bandwidth memory (HBM) chips. In some alternative embodiments, the integrated circuit components 100 may include various kinds of semiconductor chips, such as memory chips (e.g. SRAM, DRAM, RRAM and so on), application specific integrated circuits (ASICs), radio frequency integrated circuits (RF-ICs) or the combination thereof. The function of the integrated circuit components 100 mounted on the de-bonding layer DB carried by the carrier C is not limited in this disclosure.

As shown in FIG. 23, in some embodiments, after mounting the integrated circuit components 100 on the de-bonding layer DB carried by the carrier C, a plurality of first conductive pillars 102A and a plurality of first dielectric layers 104 are formed on the integrated circuit components 100. In some alternative embodiments, before mounting the integrated circuit components 100 on the de-bonding layer DB carried by the carrier C, a plurality of first conductive pillars 102A and a plurality of first dielectric layers 104 are formed on the integrated circuit components 100. The first conductive pillars 102A are electrically connected to the integrated circuit components 100 and are covered by the first dielectric layers 104.

In some embodiments, the number of the first dielectric layers 104 may be equal to the number of the integrated circuit components 100; in other words, the first conductive pillars 102A and the active surfaces 100a of the integrated circuit components 100 are covered by the first dielectric layers 104. In some alternative embodiments, the number of the first dielectric layers 104 may be less than the number of the integrated circuit components 100; in other words, part of the first conductive pillars 102A and part of the active surfaces 100a of the integrated circuit components 100 are covered by the first dielectric layers 104.

In some embodiments, the first conductive pillars 102A may be copper pillars. In some alternative embodiments, the first conductive pillars 102A may be copper pillars with solder caps (not shown) formed on top surfaces thereof. The first conductive pillars 102A may be made from other conductive materials and the disclosure is not limited thereto.

The first dielectric layer 104 is a polybenzoxazole (PBO) layer or other suitable polymer dielectric layers, for example. In some embodiments, no filler is contained in the first dielectric layer 104. In some alternative embodiments, the first dielectric layer 104 may contain filler therein.

Figure 24:
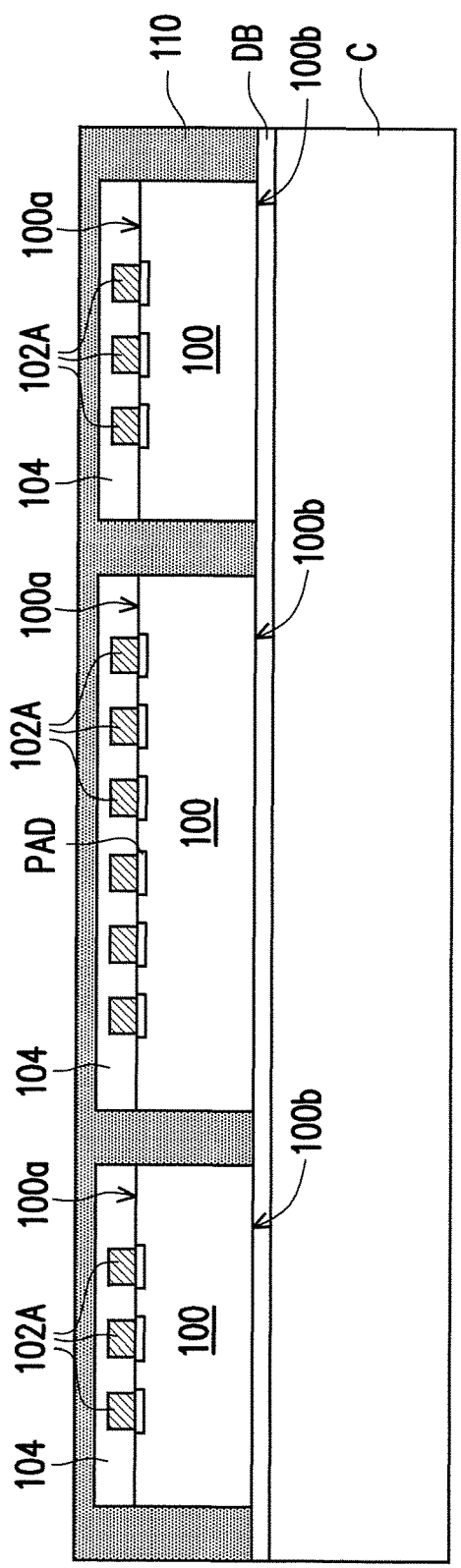

Referring to FIG. 24, an filler-containing insulating encapsulation 110 is formed on the de-bonding layer DB carried by the carrier C so as to encapsulate the integrated circuit components 100 and the first dielectric layers 104. In some embodiments, the filler-containing insulating encapsulation 110 is a molding compound formed by a molding process. For example, the filler-containing insulating encapsulation 110 may be epoxy resin and the filler added in the epoxy resin may be silica or aluminum oxide ($Al_2O_3$), or other suitable insulating material.

Figure 25:
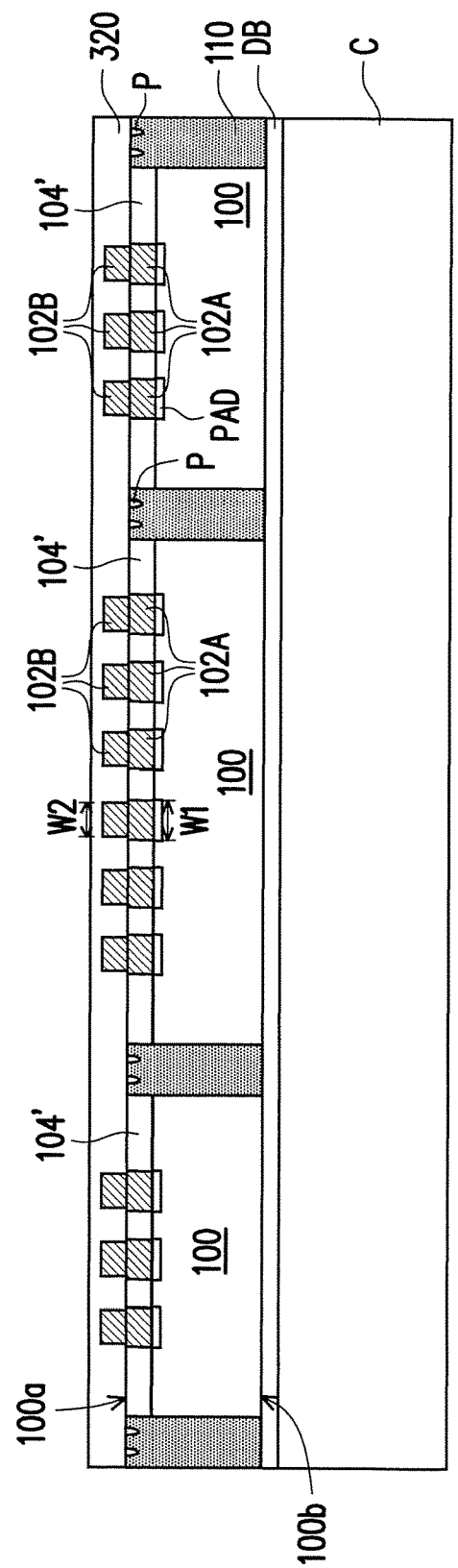

Referring to FIG. 25, the filler-containing insulating encapsulation 110 and the first dielectric layers 104 are grinded until the top surfaces of the first conductive pillars 102A are exposed. After grinding the filler-containing insulating encapsulation 110 and the first dielectric layer 104, a grinded filler-containing insulating encapsulation 110' and a plurality of first grinded dielectric layers 104' are formed and the thickness of the first grinded dielectric layer 104' is substantially equal to the height of the first conductive pillars 102A. The first conductive pillars 102A penetrate through the first grinded dielectric layer 104'. The top surface of the first grinded dielectric layer 104' and the top surfaces of the first conductive pillars 102A are substantially coplanar.

As shown in FIG. 25, pits P are generated on a grinded surface of the grinded filler-containing insulating encapsulation 110' after grinding process. In some embodiments, the width of the pits P may range from about 4 micrometers to about 50 micrometers and the depth of the pits P may range from about 2 micrometers to about 25 micrometers.

As shown in FIG. 25, a plurality of second conductive pillars 102B are formed on the first conductive pillars 102A. The second conductive pillars 102B are electrically connected to the integrated circuit components 100 through the first conductive pillars 102A. In some embodiments, the second conductive pillars 102B may be copper pillars. In some alternative embodiments, the second conductive pillars 102B may be copper pillars with solder caps (not shown) formed on top surfaces thereof. The second conductive pillars 102B may be made from other conductive materials and the disclosure is not limited thereto.

A second dielectric layer 320 is then formed on the grinded surfaces of the grinded filler-containing insulating encapsulation 110' and the first grinded dielectric layers 104' so as to encapsulate the second conductive pillars 102B. For example, the second dielectric layer 320 is a polybenzoxazole (PBO) layer or other suitable polymer dielectric layers and the second dielectric layer 320 does not contain filler therein.

Figure 26:
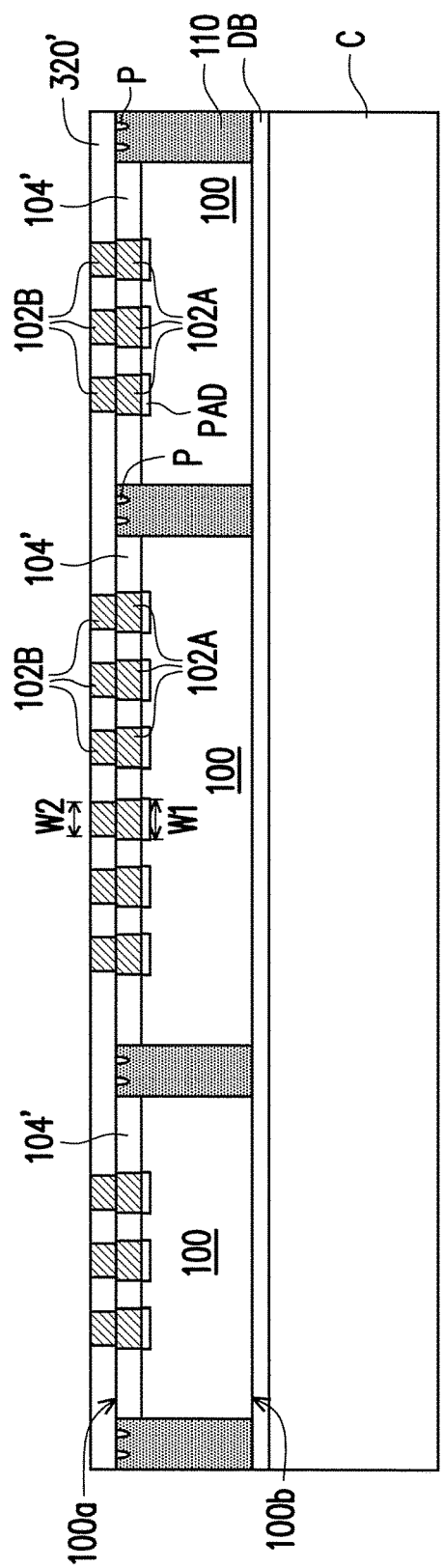

Referring to FIG. 25 and FIG. 26, a grinding process is performed on the second dielectric layer 320 until the top surface of the second conductive pillars 102B are exposed. After the grinding process of the second dielectric layer 320 is performed, a second grinded dielectric layer 320' with reduced thickness is formed and the thickness of the second grinded dielectric layer 320' is substantially equal to the height of the second conductive pillars 102B. As shown in FIG. 26, the second conductive pillars 102B penetrate through the second grinded dielectric layer 320'. Furthermore, the top surface of the second grinded dielectric layer 320' and the top surfaces of the second conductive pillars 102B are substantially coplanar.

As shown in FIG. 25 and FIG. 26, the pits P on the grinded filler-containing insulating encapsulation 110' are covered by the second dielectric layer 320 or the second grinded dielectric layer 320'. The second grinded dielectric layer 320' may fill the pits P on the grinded filler-containing insulating encapsulation 110' and provide good topography.

Since the second grinded dielectric layer 320' contains no filler, there is no pit generated on the top surface of the second grinded dielectric layer 320'. The flat and smooth top surface of the second grinded dielectric layer 320' facilitates the fabrication of the subsequently formed thin films. As shown in FIG. 26, after the grinding process is performed, the second conductive pillars 102B are laterally encapsulated by the second grinded dielectric layer 320' and the second conductive pillars 102B are accessibly exposed from the second grinded dielectric layer 320'.

As shown in FIG. 25 and FIG. 26, in some embodiments, the first width W1 of the first conductive pillars 102A is greater than the second width W2 of the second conductive pillars 102B. In some alternative embodiments, the first width of the first conductive pillars 102A is smaller than the second width of the second conductive pillars 102B.

Figure 27:
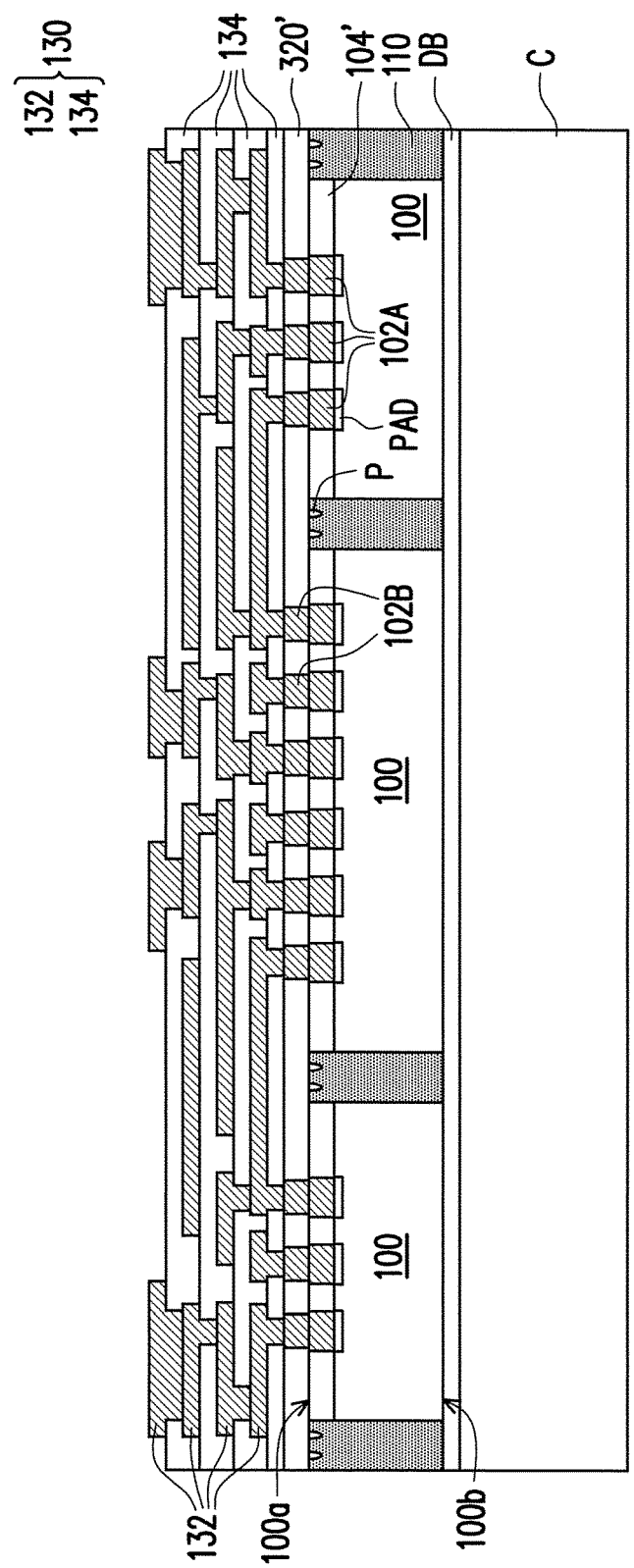

Referring to FIG. 27, a redistribution circuit structure 130 is formed on the second grinded dielectric layer 320' and the second conductive pillars 102B. The redistribution circuit structure 130 is electrically connected to the integrated circuit components 100 through the first conductive pillars 102A and the second conductive pillars 102B. Furthermore, the redistribution circuit structure 130 and the grinded filler-containing insulating encapsulation 110' are spaced apart by the second grinded dielectric layer 320'.

Figure 28:
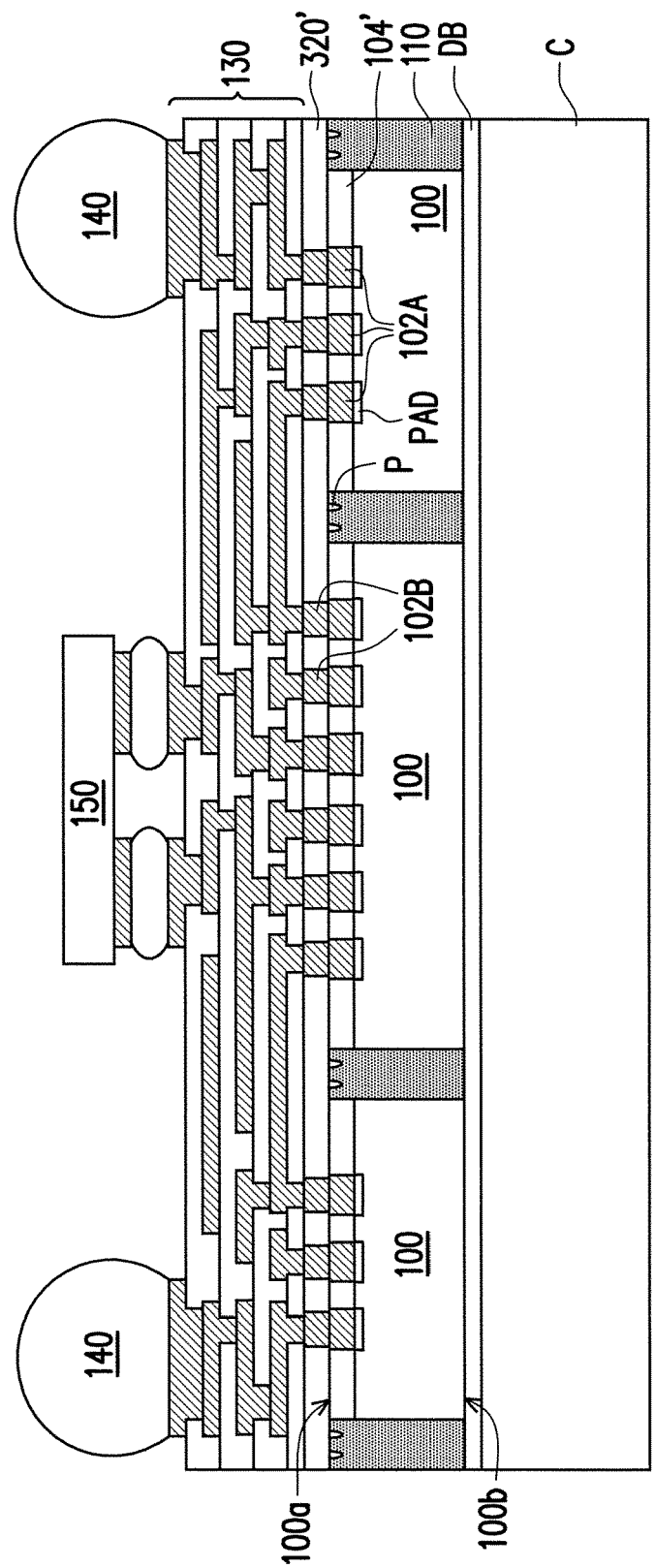
Figure 29:
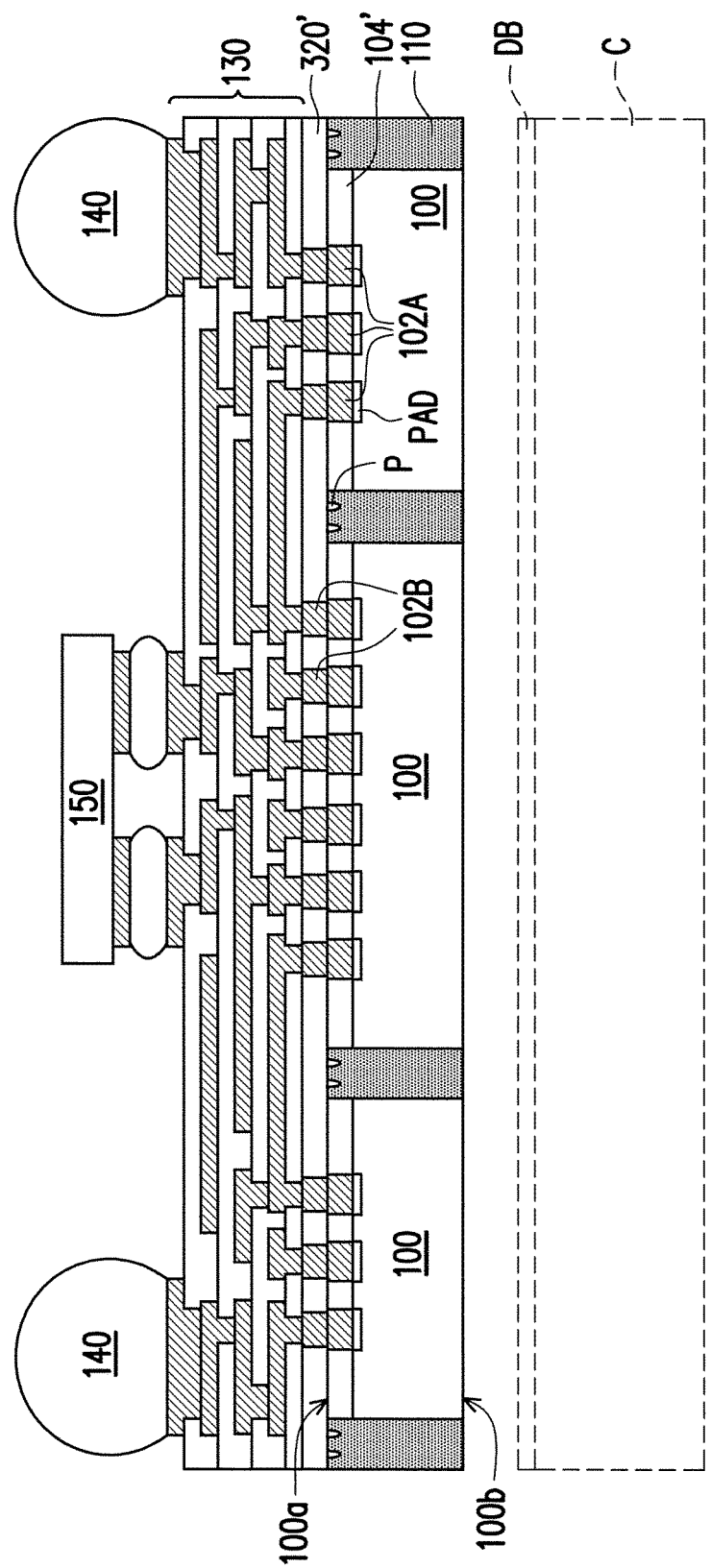

Referring to FIG. 28 through FIG. 29, the processes (i.e. the mounting process of the conductive terminals 140 and/or the at least one passive component 150 and the de-bonding process) illustrated in FIG. 28 through FIG. 29 are similar with those illustrated in FIG. 6 through FIG. 7 and the detailed descriptions thereof are thus omitted.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the present disclosure, a method of fabricating an integrated fan-out package is provided. The method includes the followings. An integrated circuit component is mounted on a carrier. An insulating encapsulation is formed on the carrier to encapsulate sidewalls of the integrated circuit component. A plurality of conductive pillars are formed on the integrated circuit component and a dielectric layer is formed to cover the integrated circuit component and the insulating encapsulation, wherein the plurality of conductive pillars penetrate through the dielectric layer and are electrically connected to the integrated circuit component. A redistribution circuit structure is formed on the dielectric layer and the plurality of conductive pillars, wherein the redistribution circuit structure is electrically connected to the integrated circuit component through the plurality of conductive pillars, and the redistribution circuit structure and the insulating encapsulation are spaced apart by the dielectric layer.

In accordance with alternative embodiments of the present disclosure, a method of fabricating an integrated fan-out package is provided. The method includes the followings. An integrated circuit component is mounted on a carrier. A plurality of first conductive pillars are formed on the integrated circuit component, and the plurality of first conductive pillars are electrically connected to the integrated circuit component. A first dielectric layer is formed on the integrated circuit component to cover the plurality of first conductive pillars. A filler-containing insulating encapsulation is formed on the carrier to encapsulate the integrated circuit component and the first dielectric layer. The filler-containing insulating encapsulation and the first dielectric layer are grinded until the plurality of first conductive pillars are exposed. A plurality of second conductive pillars are formed on the plurality of first conductive pillars. A second dielectric layer is formed on the first dielectric layer and the filler-containing insulating encapsulation to cover the plurality of second conductive pillars. The second dielectric layer is grinded until the plurality of second conductive pillars are exposed. A redistribution circuit structure is formed on the second dielectric layer and the plurality of second conductive pillars, and the redistribution circuit structure is electrically connected to the integrated circuit component through the plurality of first conductive pillars and the plurality of second conductive pillars.

In accordance with yet alternative embodiments of the present disclosure, an integrated fan-out package including an integrated circuit component, an filler-containing insulating encapsulation, a plurality of conductive pillars, a dielectric layer and a redistribution circuit structure is provided. The filler-containing insulating encapsulation laterally encapsulates the sidewalls of the integrated circuit component. The plurality of conductive pillars are disposed on the integrated circuit component. The dielectric layer covers the integrated circuit component and the filler-containing insulating encapsulation. The plurality of conductive pillars penetrate through the dielectric layer and are electrically connected to the integrated circuit component. The redistribution circuit structure is disposed on the dielectric layer and the plurality of conductive pillars, wherein the redistribution circuit structure is electrically connected to the integrated circuit component through the plurality of conductive pillars, and the redistribution circuit structure and the filler-containing insulating encapsulation are spaced apart by the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated fan-out package, the method comprising:

mounting an integrated circuit component on a carrier;

forming an insulating encapsulation on the carrier to encapsulate sidewalls of the integrated circuit component;
forming a plurality of conductive pillars on the integrated circuit component;
forming a dielectric layer to cover the integrated circuit component and the insulating encapsulation, each of the plurality of conductive pillars completely penetrating through the dielectric layer and being electrically connected to the integrated circuit component, and a material of the dielectric layer is different from a material of the insulating encapsulation; and
forming a redistribution circuit structure on the dielectric layer and the plurality of conductive pillars, the redistribution circuit structure being electrically connected to the integrated circuit component through the plurality of conductive pillars, and the redistribution circuit structure and the insulating encapsulation being spaced apart by the dielectric layer.

2. The method of claim 1, wherein the plurality of conductive pillars are formed on the integrated circuit component prior to mounting the integrated circuit component on a carrier.

3. The method of claim 2, wherein the dielectric layer is formed after forming a plurality of conductive pillars on the integrated circuit component, and top surfaces of the dielectric layer and the plurality of conductive pillars are substantially coplanar.

4. The method of claim 1, wherein the plurality of conductive pillars are formed on the integrated circuit component after mounting the integrated circuit component on a carrier.

5. The method of claim 4, wherein the dielectric layer is formed after forming a plurality of conductive pillars on the integrated circuit component.

6. The method of claim 1, wherein the dielectric layer comprises a plurality of openings for accommodating the plurality of conductive pillars, and the dielectric layer comprising the plurality of openings is formed prior to forming a plurality of conductive pillars on the integrated circuit component.

7. The method of claim 1 further comprising:
de-bonding the integrated circuit component and the insulating encapsulation from the carrier.

8. A method of fabricating an integrated fan-out package, the method comprising:
mounting an integrated circuit component on a carrier;
forming a plurality of first conductive pillars on the integrated circuit component, the plurality of first conductive pillars being electrically connected to the integrated circuit component;
forming a first dielectric layer on the integrated circuit component to cover the plurality of first conductive pillars;
forming a filler-containing insulating encapsulation on the carrier to encapsulate the integrated circuit component and the first dielectric layer;
grinding the filler-containing insulating encapsulation and the first dielectric layer until the plurality of first conductive pillars are exposed;
forming a plurality of second conductive pillars on the plurality of first conductive pillars;
forming a second dielectric layer on the first dielectric layer and the filler-containing insulating encapsulation to cover the plurality of second conductive pillars and a surface of the filler-containing insulating encapsulation being grinded, wherein the filler-containing insulating encapsulation is physically separated from the plurality of second conductive pillars by the second dielectric layer;
grinding the second dielectric layer until the plurality of second conductive pillars are exposed; and
forming a redistribution circuit structure on the second dielectric layer and the plurality of second conductive pillars, the redistribution circuit structure being electrically connected to the integrated circuit component through the plurality of first conductive pillars and the plurality of second conductive pillars.

9. The method of claim 8, wherein the integrated circuit component comprises an active surface, a rear surface opposite to the active surface and a plurality of pads distributed on the active surface, the rear surface of the integrated circuit component is adhered with the carrier, and the plurality of first conductive pillars are formed on and electrically connected to the pads.

10. The method of claim 8, wherein a height of the plurality of first conductive pillars is substantially equal to a thickness of the first dielectric layer after grinding the filler-containing insulating encapsulation and the first dielectric layer.

11. The method of claim 8, wherein a height of the plurality of second conductive pillars is substantially equal to a thickness of the second dielectric layer after grinding the second dielectric layer.

12. The method of claim 8, wherein a first width of the plurality of first conductive pillars is greater than a second width of the plurality of second conductive pillars.

13. The method of claim 8, wherein a first width of the plurality of first conductive pillars is smaller than a second width of the plurality of second conductive pillars.

14. The method of claim 8, wherein a plurality of pits are generated on a grinded surface of the filler-containing insulating encapsulation after grinding the filler-containing insulating encapsulation and the first dielectric layer.

15. The method of claim 14, wherein the plurality of pits on the grinded surface of the filler-containing insulating encapsulation are covered by the second dielectric layer after forming the second dielectric layer on the first dielectric layer and the filler-containing insulating encapsulation.

16. The method of claim 8, wherein the second dielectric layer contains no filler.

17. The method of claim 8, wherein the first dielectric layer and the second dielectric layer contain no filler.

18. The method of claim 8 further comprising:
de-bonding the integrated circuit component and the insulating encapsulation from the carrier.

19. An integrated fan-out package, comprising:
an integrated circuit component;
an filler-containing insulating encapsulation laterally encapsulating sidewalls of the integrated circuit component;
a plurality of conductive pillars disposed on the integrated circuit component;
a dielectric layer covering the integrated circuit component and the filler-containing insulating encapsulation, each of the plurality of conductive pillars completely penetrating through the dielectric layer and being electrically connected to the integrated circuit component, and a material of the dielectric layer is different from a material of the filler-containing insulating encapsulation; and
a redistribution circuit structure disposed on the dielectric layer and the plurality of conductive pillars, the redistribution circuit structure being electrically connected to the integrated circuit component through the plurality of conductive pillars, and the redistribution circuit structure and the filler-containing insulating encapsulation being spaced apart by the dielectric layer.

20. The package of claim 19, wherein the dielectric layer contains no filler.

* * * * *